(12) United States Patent
Ebata et al.

(10) Patent No.: US 11,443,943 B2
(45) Date of Patent: Sep. 13, 2022

(54) SPUTTERING TARGET, OXIDE SEMICONDUCTOR THIN FILM, AND METHOD FOR PRODUCING THESE

(71) Applicant: Idemitsu Kosan Co., Ltd., Tokyo (JP)

(72) Inventors: Kazuaki Ebata, Sodegaura (JP); Nozomi Tajima, Sodegaura (JP)

(73) Assignee: Idemitsu Kosam Co., Ltd., Tokyo (JP)

( * ) Notice: Subject to any disclaimer, the term of this patent is extended or adjusted under 35 U.S.C. 154(b) by 413 days.

(21) Appl. No.: 16/211,211

(22) Filed: Dec. 5, 2018

(65) Prior Publication Data

US 2019/0109001 A1 Apr. 11, 2019

Related U.S. Application Data

(63) Continuation of application No. 14/442,686, filed as application No. PCT/JP2013/006597 on Nov. 8, 2013, now abandoned.

(30) Foreign Application Priority Data

Nov. 14, 2012 (JP) .................................. 2012-250303

(51) Int. Cl.
*H01L 21/02* (2006.01)
*C04B 35/453* (2006.01)
(Continued)

(52) U.S. Cl.
CPC ........ *H01L 21/02554* (2013.01); *C04B 35/01* (2013.01); *C04B 35/453* (2013.01);
(Continued)

(58) Field of Classification Search
CPC ......... H01L 21/02554; H01L 21/02565; H01L 21/02631; H01L 29/22; H01L 29/66742; H01L 29/66969; H01L 29/7869; C04B 35/00; C04B 35/01; C04B 35/453; C04B 2235/3217; C04B 2235/3284;
(Continued)

(56) References Cited

U.S. PATENT DOCUMENTS

| 5,622,653 A | 4/1997 | Orita et al. |
| 5,681,671 A | 10/1997 | Orita et al. |

(Continued)

FOREIGN PATENT DOCUMENTS

| CN | 101911303 A | 12/2010 |
| CN | 102105619 A | 6/2011 |

(Continued)

OTHER PUBLICATIONS

Machine Translation JP 2007-073697 (Year: 2007).*

(Continued)

*Primary Examiner* — Rodney G McDonald
(74) *Attorney, Agent, or Firm* — Foley & Lardner LLP

(57) ABSTRACT

A sputtering target including an oxide that includes an indium (In) element, a tin (Sn) element, a zinc (Zn) element and an aluminum (Al) element, wherein the oxide includes a homologous structure compound represented by $InAlO_3(ZnO)_m$ (m is 0.1 to 10) and a bixbyite structure compound represented by $In_2O_3$.

9 Claims, 4 Drawing Sheets

(51) Int. Cl.
| | |
|---|---|
| *C23C 14/08* | (2006.01) |
| *C23C 14/34* | (2006.01) |
| *C23C 14/35* | (2006.01) |
| *H01L 29/786* | (2006.01) |
| *C04B 35/01* | (2006.01) |
| *H01L 29/66* | (2006.01) |
| *H01L 29/22* | (2006.01) |

(52) U.S. Cl.
CPC .......... *C23C 14/08* (2013.01); *C23C 14/3414* (2013.01); *C23C 14/352* (2013.01); *H01L 21/02565* (2013.01); *H01L 21/02631* (2013.01); *H01L 29/22* (2013.01); *H01L 29/66969* (2013.01); *H01L 29/7869* (2013.01); *C04B 2235/3217* (2013.01); *C04B 2235/3284* (2013.01); *C04B 2235/3286* (2013.01); *C04B 2235/3293* (2013.01); *C04B 2235/5445* (2013.01); *C04B 2235/6562* (2013.01); *C04B 2235/6565* (2013.01); *C04B 2235/6567* (2013.01); *C04B 2235/77* (2013.01); *C04B 2235/80* (2013.01)

(58) Field of Classification Search
CPC .... C04B 2235/3293; C04B 2235/5445; C04B 2235/6562; C04B 2235/6565; C04B 2235/6567; C04B 2235/77; C04B 2235/80; C23C 14/08; C23C 14/3407; C23C 14/3414; C23C 14/352
USPC ............. 204/192.25, 192.29, 298.12, 298.13
See application file for complete search history.

(56) References Cited

U.S. PATENT DOCUMENTS

| | | | |
|---|---|---|---|
| 5,843,341 A | 12/1998 | Orita et al. | |
| 5,955,178 A | 9/1999 | Orita et al. | |
| 7,977,255 B1 * | 7/2011 | Scheer | H01L 21/0214 438/776 |
| 8,461,583 B2 | 6/2013 | Yano et al. | |
| 8,623,511 B2 | 1/2014 | Kawashima et al. | |
| 8,723,175 B2 | 5/2014 | Yano et al. | |
| 8,791,457 B2 | 7/2014 | Yano et al. | |
| 9,214,519 B2 * | 12/2015 | Itose | C23C 14/086 |
| 2003/0062255 A1 * | 4/2003 | Haag | C23C 14/35 204/192.12 |
| 2006/0147740 A1 | 7/2006 | Hosono et al. | |
| 2007/0194379 A1 | 8/2007 | Hosono et al. | |
| 2008/0299415 A1 | 12/2008 | Hosono et al. | |
| 2009/0278122 A1 | 11/2009 | Hosono et al. | |
| 2009/0280600 A1 | 11/2009 | Hosono et al. | |
| 2010/0155717 A1 | 6/2010 | Yano et al. | |
| 2010/0167000 A1 | 7/2010 | Hosono et al. | |
| 2010/0240521 A1 | 9/2010 | Hosono et al. | |
| 2010/0276688 A1 | 11/2010 | Yano et al. | |
| 2011/0101352 A1 | 5/2011 | Hosono et al. | |
| 2011/0168994 A1 | 7/2011 | Kawashima et al. | |
| 2011/0201162 A1 | 8/2011 | Hosono et al. | |
| 2011/0306165 A1 | 12/2011 | Ikisawa et al. | |
| 2012/0012838 A1 | 1/2012 | Hosono et al. | |
| 2013/0140175 A1 | 6/2013 | Yano et al. | |
| 2013/0285053 A1 | 10/2013 | Kawashima et al. | |
| 2013/0313548 A1 | 11/2013 | Yano et al. | |

FOREIGN PATENT DOCUMENTS

| | | | |
|---|---|---|---|
| EP | 1 717 335 A1 | | 11/2006 |
| EP | 1 717 336 A1 | | 11/2006 |
| EP | 1 985 725 A2 | | 10/2008 |
| EP | 2 022 871 A2 | | 2/2009 |
| EP | 2 028 287 A1 | | 2/2009 |
| JP | H7-333438 A | | 12/1995 |
| JP | H08-245220 A | | 9/1996 |
| JP | H9-071860 A | | 3/1997 |
| JP | 2007-073312 A | | 3/2007 |
| JP | 2007-073697 | * | 3/2007 |
| JP | 2008-243928 A | | 10/2008 |
| JP | 2009-80924 A | | 4/2009 |
| WO | WO-2005/078152 A1 | | 8/2005 |
| WO | WO-2005/078153 A1 | | 8/2005 |
| WO | WO-2005/088726 A1 | | 9/2005 |
| WO | WO-2009/081885 A1 | | 7/2009 |
| WO | WO-2009/084537 A1 | | 7/2009 |
| WO | WO-2011/132418 A1 | | 10/2011 |
| WO | WO 2012153507 | * | 11/2012 |

OTHER PUBLICATIONS

Office Action dated Jul. 22, 2020 for corresponding Chinese Patent Application No. 201810641136.9.

International Preliminary Report on Patentability and Written Opinion dated May 28, 2015 issued in Application No. PCT/JP2013/006597.

International Search Report dated Feb. 10, 2014 issued in Application No. PCT/JP2013/006597.

Office Action issued in Japanese Patent Application No. 2012-250303 dated Jul. 12, 2016.

Office Action issued in Chinese Patent Application No. 201380052096.X dated Sep. 7, 2016.

* cited by examiner

SPUTTERING TARGET, OXIDE SEMICONDUCTOR THIN FILM, AND METHOD FOR PRODUCING THESE

CROSS REFERENCE TO RELATED APPLICATIONS

This application is a continuation of U.S. application Ser. No. 14/442,686, filed May 13, 2015, which is the National Phase of PCT/JP2013/006597, filed Nov. 8, 2013, which claims priority to Japanese Application No. 2012-250303, filed Nov. 14, 2012.

TECHNICAL FIELD

The invention relates to a sputtering target, a thin film prepared by using the target and a thin film transistor that comprises the thin film.

BACKGROUND ART

Field effect transistors, such as a thin film transistor (TFT), are widely used as the unit electronic device of a semiconductor memory integrated circuit, a high frequency signal amplification device, a device for driving a liquid crystal, or the like, and they are electronic devices which are currently most widely put into practical use. Among these, with significant development in displays in recent years, in various displays such as a liquid crystal display (LCD), an electroluminescence display (EL) and a field emission display (FED), a TFT is frequently used as a switching device which drives a display by applying a driving voltage to a display device.

As a material of a semiconductor layer (channel layer) which is a main element of a field effect transistor, a silicon semiconductor compound is used most widely. Generally, a silicon single crystal is used for a high frequency amplification device, a device for integrated circuits or the like which need high-speed operation. On the other hand, an amorphous silicon semiconductor (amorphous silicon) is used for a device for driving a liquid crystal or the like in order to satisfy the demand for realizing a large-area display.

A thin film of amorphous silicon can be formed at relatively low temperatures. However, the switching speed thereof is slow as compared with that of a crystalline thin film. Therefore, when it is used as a switching device that drives a display, it may be unable to follow the display of a high-speed animation. Specifically, amorphous silicon having a mobility of 0.5 to 1 $cm^2/Vs$ could be used in a liquid crystal television of which the resolution is VGA. However, if the resolution is equal to or more than SXGA, UXGA and QXGA, a mobility of 2 $cm^2/Vs$ or more is required. Moreover, if the driving frequency is increased in order to improve the image quality, a further higher mobility is required.

On the other hand, as for a crystalline silicon-based thin film, although it has a high mobility, there are problems that a large amount of energy and a large number of steps are required for the production, and that large-area film formation is difficult. For example, when a silicon-based thin film is crystallized, a high temperature of 800° C. or more or laser annealing which needs expensive equipment is required. In the case of a crystalline silicon-based thin film, the device configuration of a TFT is normally restricted to a top-gate configuration, and hence, reduction in production cost such as decrease in number of masks is difficult.

In order to solve the problem, a thin film transistor using an oxide semiconductor film formed of indium oxide, zinc oxide and gallium oxide has been studied. In general, an oxide semiconductor thin film is formed by sputtering using a target (sputtering target) composed of an oxide sintered body.

For example, a target formed of a compound showing a homologous crystal structure such as that represented by a general formulas $In_2Ga_2ZnO_7$ and $InGaZnO_4$ is known (Patent Documents 1, 2 and 3). However, in this target, in order to increase the sintering density (relative density), it is required to conduct sintering in an oxidizing atmosphere. In this case, in order to reduce the resistance of the target, a reduction treatment at a high temperature is required to be conducted after sintering. Further, if the target is used for a long period of time, problems arise that the properties of the resulting film or the film-forming speed largely change; abnormal discharge due to abnormal growth of $InGaZnO_4$ or $In_2Ga_2ZnO_7$ occurs; particles are frequently generated during film formation or the like. If abnormal discharge occurs frequently, plasma discharge state becomes unstable, and as a result, stable film-formation is not conducted, adversely affecting the film properties.

On the other hand, a thin film transistor that is obtained by using an amorphous oxide semiconductor film that does not contain gallium and is composed of indium oxide and zinc oxide has been proposed (Patent Document 4). However, this thin film transistor has a problem that a normally-off operation of a TFT cannot be realized if the oxygen partial pressure at the time of film formation is not increased.

Further, studies have been made on a sputtering target for forming a protective layer of an optical information recording medium, that is obtained by adding an additive element such as Ta, Y, Si or the like to an $In_2O_3$—$SnO_2$—ZnO-based oxide composed mainly of tin oxide (Patent Documents 5 and 6). However, these targets are not used for forming an oxide semiconductor and they have problems that an agglomerate of an insulating material is likely to be formed easily, whereby the resistance is increased or abnormal discharge tends to occur easily.

RELATED ART DOCUMENTS

Patent Documents

Patent Document 1: JP-A-H08-245220
Patent Document 2: JP-A-2007-73312
Patent Document 3: WO2009/084537
Patent Document 4: WO2005/088726
Patent Document 5: WO2005/078152
Patent Document 6: WO2005/078153

SUMMARY OF THE INVENTION

An object of the invention is to provide a high-density and low-resistant sputtering target.

Another object of the invention is to provide a thin film transistor having a high field effect mobility and high reliability.

In order to attain the above-mentioned object, the inventors of the invention made extensive studies. As a result, the inventors have found that a sputtering target comprising an oxide that contains an indium (In) element, a tin (Sn) element, a zinc (Zn) element and an aluminum (Al) element and comprising a homologous structure compound represented by $InAlO_3(ZnO)_m$ (m is 0.1 to 10) and a bixbyite structure represented by $In_2O_3$ has a high relative density and has a low resistance. Further, the inventors have found that a TFT using a thin film obtained by using this target in a channel layer has a high field effect mobility and has a high reliability. The invention has been completed based on these findings.

According to the invention, the following sputtering target or the like are provided.

1. A sputtering target comprising an oxide that comprises an indium (In) element, a tin (Sn) element, a zinc (Zn) element and an aluminum (Al) element, wherein the oxide comprises a homologous structure compound represented by $InAlO_3(ZnO)_m$ (m is 0.1 to 10) and a bixbyite structure compound represented by $In_2O_3$.
2. The sputtering target according to 1, wherein the homologous structure compound is one or more selected from homologous structure compounds represented by $InAlZn_4O_7$, $InAlZn_3O_6$, $InAlZn_2O_5$ and $InAlZnO_4$.
3. The sputtering target according to 1 or 2, wherein the atomic ratio of In, Sn, Zn and Al satisfies the following formulas (1) to (4):

$$0.10 \leq In/(In+Sn+Zn+Al) \leq 0.75 \quad (1)$$

$$0.01 \leq Sn/(In+Sn+Zn+Al) \leq 0.30 \quad (2)$$

$$0.10 \leq Zn/(In+Sn+Zn+Al) \leq 0.70 \quad (3)$$

$$0.01 \leq Al/(In+Sn+Zn+Al) \leq 0.40 \quad (4)$$

wherein in the formulas In, Sn, Zn and Al independently indicate an atomic ratio of each element in the sputtering target.
4. The sputtering target according to any one of 1 to 3 that has a relative density of 98% or more.
5. The sputtering target according to any one of 1 to 4 that has a bulk specific resistance of 10 mΩcm or less.
6. The sputtering target according to any one of 1 to 5 that does not comprise a spinel structure compound represented by $Zn_2SnO_4$.
7. An oxide semiconductor thin film formed by a sputtering method with the use of the sputtering target according to any one of 1 to 6.
8. A method for producing an oxide semiconductor thin film, wherein the film is formed by a sputtering method with the use of the sputtering target according to any one of 1 to 6 in an atmosphere of a mixed gas that comprises: one or more selected from water vapor, an oxygen gas and a nitrous oxide gas; and a rare gas.
9. The method for producing an oxide semiconductor thin film according to 8, wherein the formation of the oxide semiconductor thin film is conducted in an atmosphere of a mixed gas that comprises a rare gas and at least water vapor.
10. The method for producing an oxide semiconductor thin film according to 9, wherein the ratio of the water vapor contained in the mixed gas is 0.1% to 25% in terms of a partial pressure ratio.
11. The method for producing the oxide semiconductor thin film according to any one of 8 to 10 comprising:
   transporting substrates in sequence to positions opposing to 3 or more of the sputtering targets arranged in parallel with a prescribed interval in a vacuum chamber;
   applying a negative potential and a positive potential alternately from an AC power source to each of the targets; and
   causing plasma to be generated on the target by applying at least one output from the AC power source while switching the target to which a potential is applied among two or more targets that are divergently connected to this AC power source, thereby forming a film on a substrate surface.
12. The method for producing an oxide semiconductor thin film according to 11, wherein the AC power density of the AC power source is 3 W/cm² or more and 20 W/cm² or less.
13. The method for producing an oxide semiconductor thin film according to 11 or 12, wherein the frequency of the AC power source is 10 kHz to 1 MHz.
14. A thin film transistor comprising, as a channel layer, the oxide semiconductor thin film formed by the method for producing an oxide semiconductor thin film according to any one of 8 to 13.
15. The thin film transistor according to 14 that has a field effect mobility of 10 cm²/Vs or more.

According to the invention, it is possible to provide a high-density and low-resistant sputtering target.

According to the invention, it is possible to provide a thin film transistor having a high field effect mobility and high reliability.

MODE FOR CARRYING OUT THE INVENTION

Figure 1:
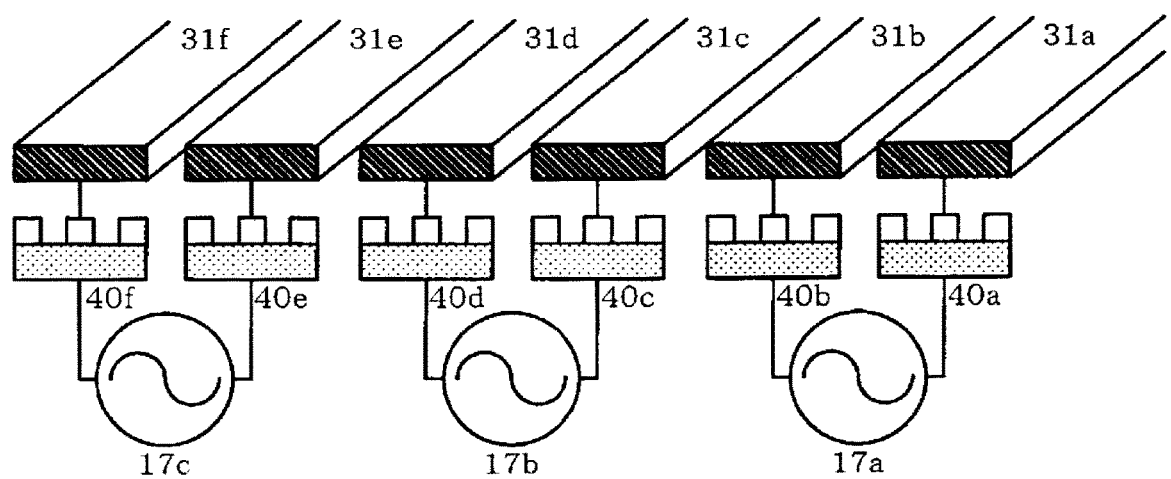
FIG. 1 is a view showing a sputtering apparatus used in one embodiment of the invention.
Figure 2:
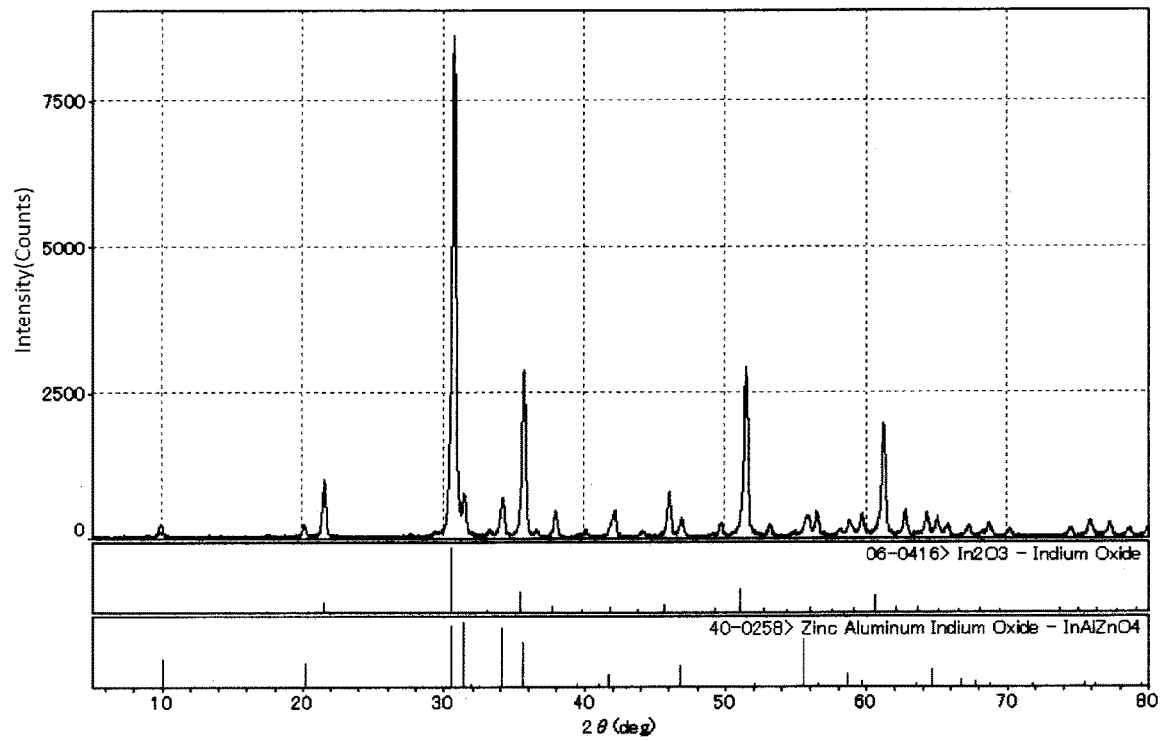
FIG. 2 is a view showing an X-ray diffraction chart of a sintered body obtained in Example 1.
Figure 3:
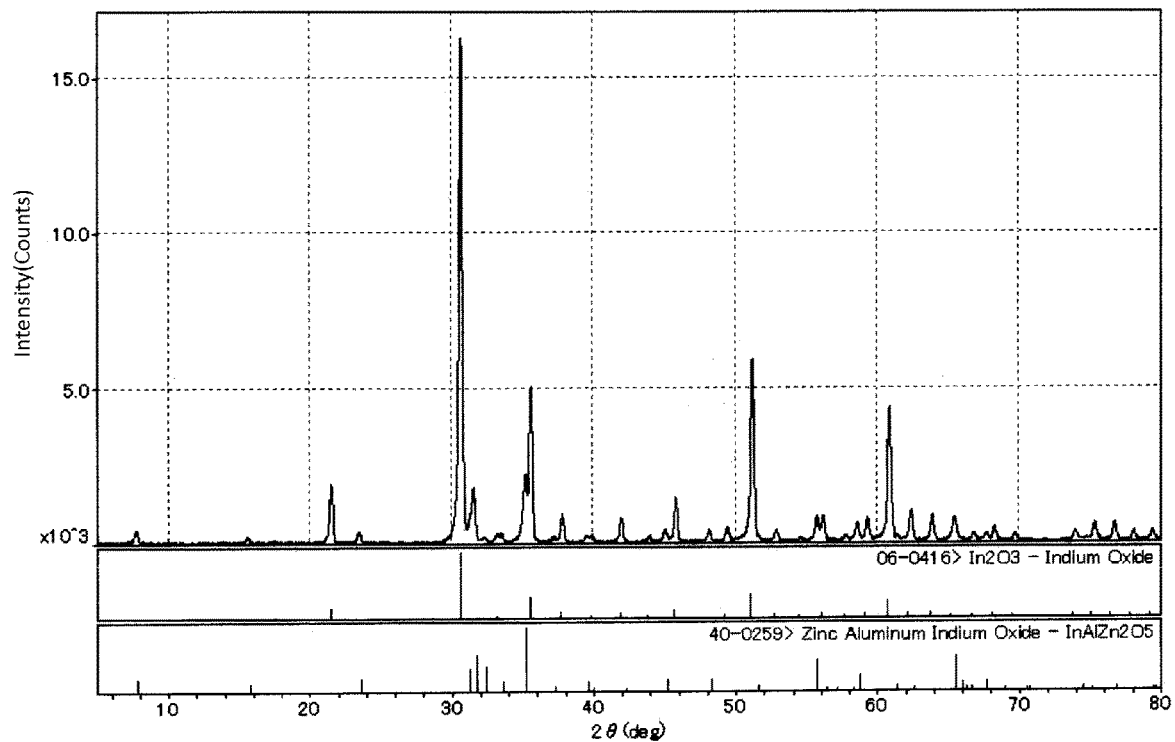
FIG. 3 is a view showing an X-ray diffraction chart of a sintered body obtained in Example 2.
Figure 4:
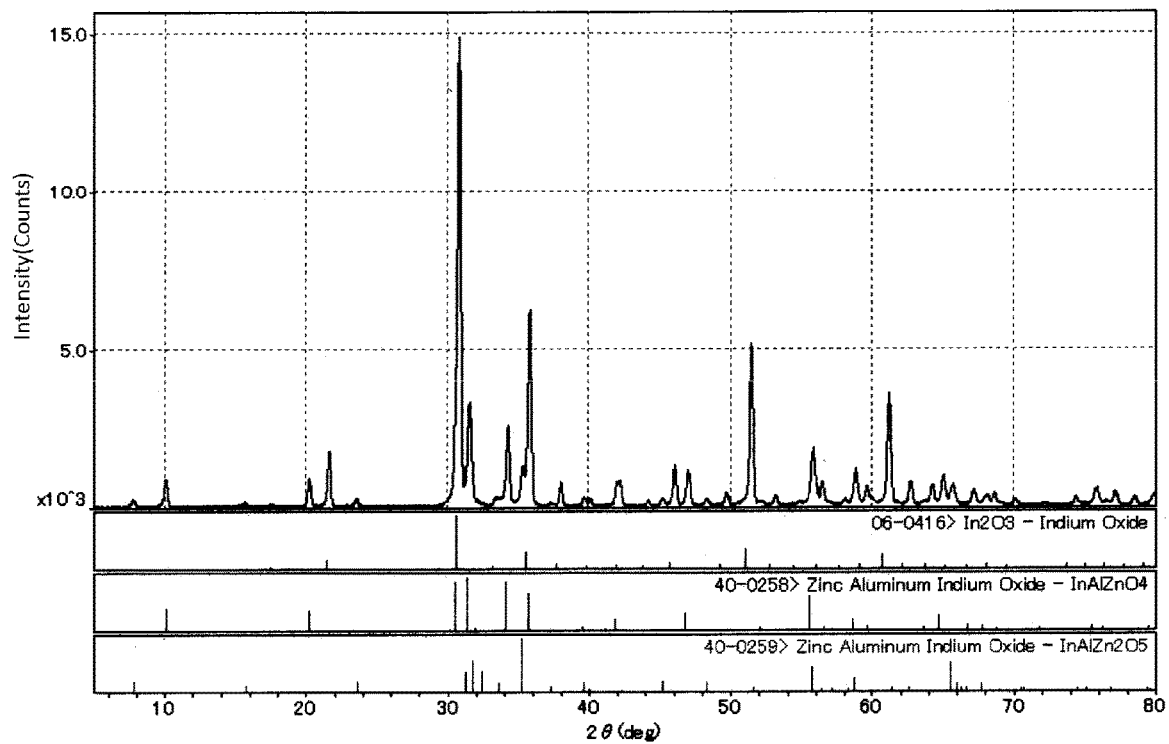
FIG. 4 is a view showing an X-ray diffraction chart of a sintered body obtained in Example 3.
Figure 5:
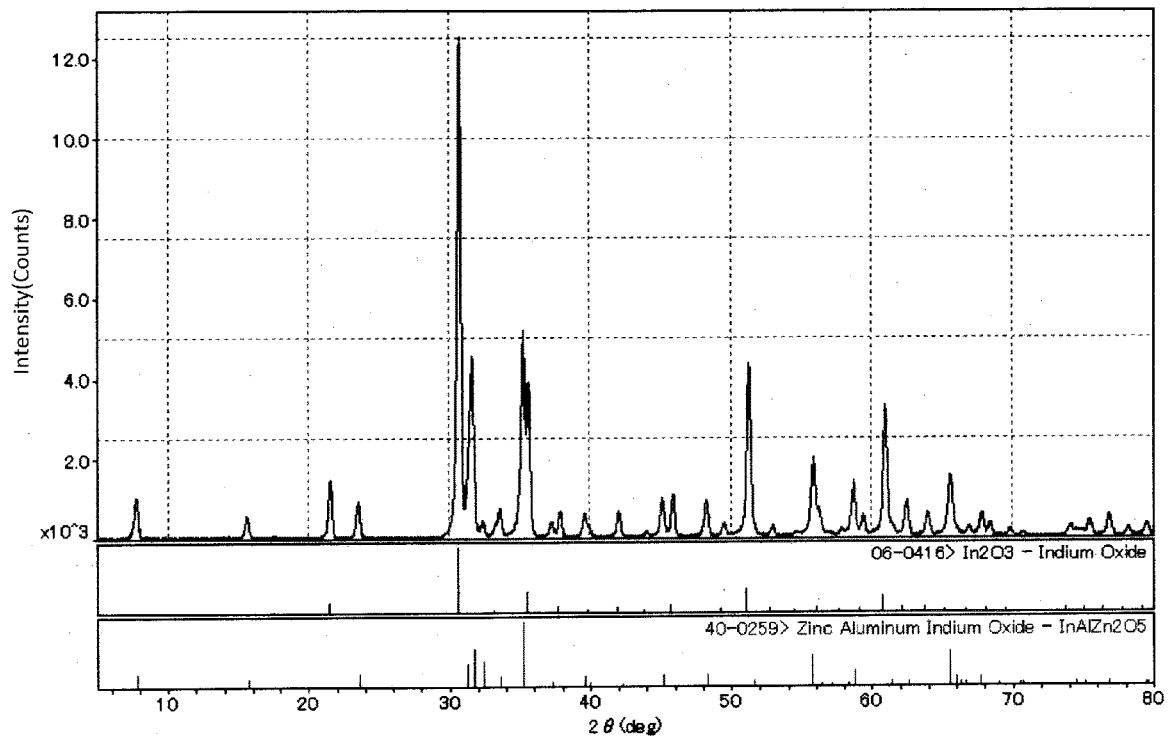
FIG. 5 is a view showing an X-ray diffraction chart of a sintered body obtained in Example 4.
Figure 6:
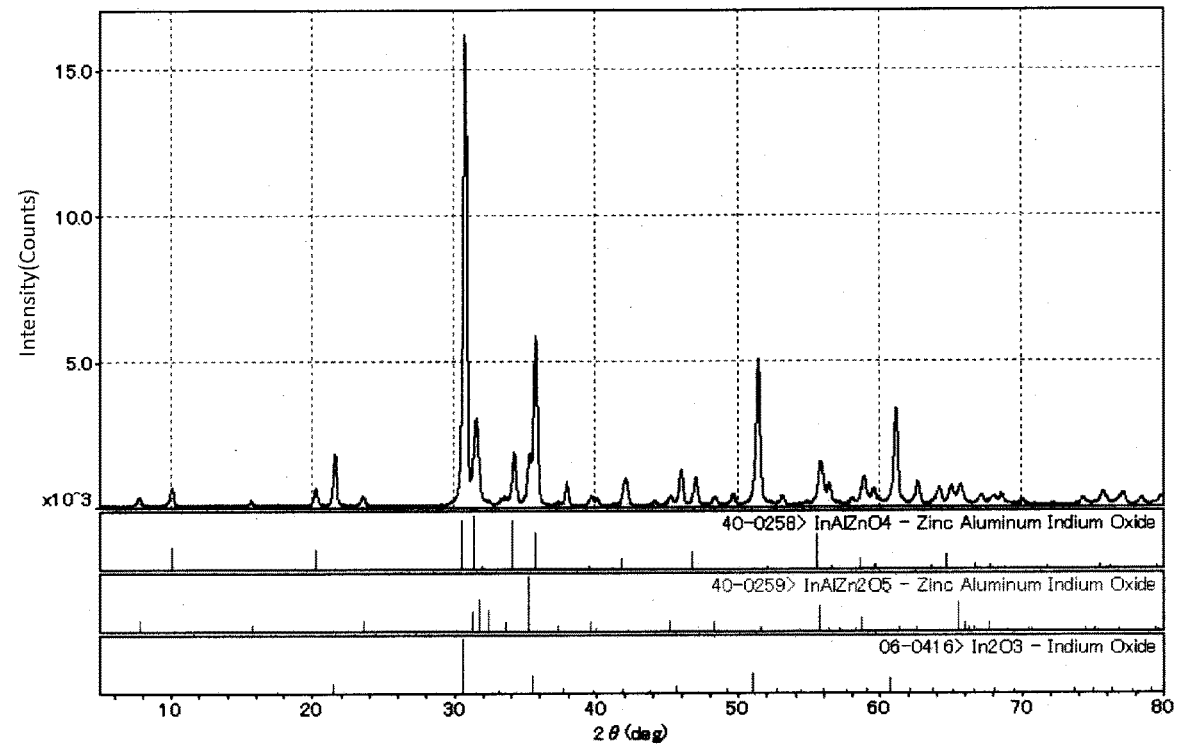
FIG. 6 is a view showing an X-ray diffraction chart of a sintered body obtained in Example 5.
Figure 7:
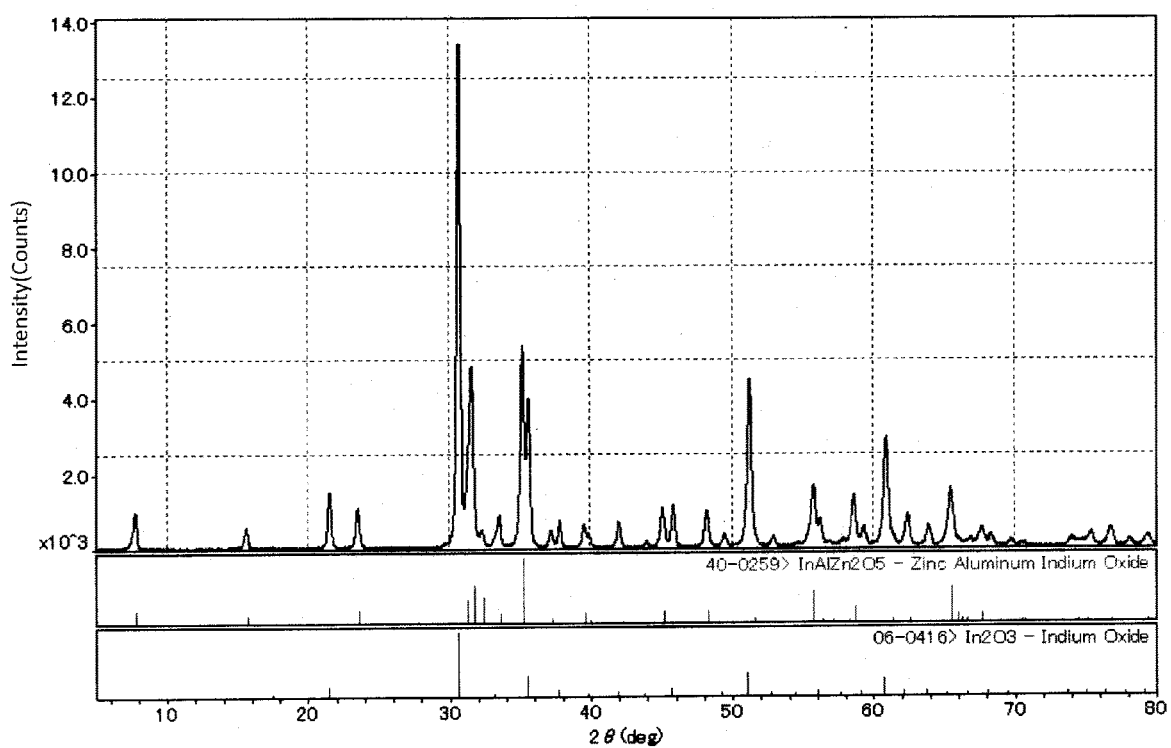
FIG. 7 is a view showing an X-ray diffraction chart of a sintered body obtained in Example 6.

Hereinbelow, a detailed explanation will be made on the sputtering target or the like of the invention. The invention is, however, not limited to the following embodiment and examples.

1. Sputtering Target

The sputtering target of the invention comprises an oxide that contains an indium (In) element, a tin (Sn) element, a zinc (Zn) element and an aluminum (Al) element, and is characterized in that it comprises a homologous structure compound represented by $InAlO_3(ZnO)_m$ (m is 0.1 to 10) and a bixbyite structure represented by $In_2O_3$.

In the invention, due to the presence of the homologous structure compound and the bixbyite structure compound mentioned above, the target has a high relative density and a low bulk resistance.

Therefore, occurrence of abnormal discharge can be suppressed when sputtering is conducted using the target of the invention. Further, the target of the invention can form a high-quality oxide semiconductor thin film efficiently, at a low cost and with a small energy.

The homologous structure compound represented by $InAlO_3(ZnO)_m$ (m is 0.1 to 10) can be confirmed by the fact that a peak derived from the homologous structure compound can be observed as a result of an X-ray diffraction analysis of the target (oxide sintered body).

In the homologous structure compound represented by InAlO$_3$(ZnO)$_m$ (m is 0.1 to 10), m is 0.1 to 10, preferably 0.5 to 8, and further preferably 1 to 7. m is preferably an integer.

The homologous structure compound represented by InAlO$_3$(ZnO)$_m$ (m is 0.1 to 10) is preferably one or more selected from homologous structure compounds represented by InAlZn$_4$O$_7$, InAlZn$_3$O$_6$, InAlZn$_2$O$_5$ and InAlZnO$_4$.

The homologous crystal structure is a crystal structure formed of a long-period "natural superlattice" structure in which crystal layers of different substances are stacked. If the crystal period or the thickness of each thin film layer is on an about nanometer level, a homologous structure compound can exhibit inherent characteristics that differ from the characteristics of a single substance or a mixed crystal in which the layers are uniformly mixed depending on combination of the chemical composition or the thickness of each layer.

The crystal structure of the homologous phase can be confirmed by a fact that an X-ray diffraction pattern measured from powder obtained by pulverizing the target coincident with an X-ray diffraction pattern of the crystal structure of the homologous phase assumed from the composition ratio. Specifically, it can be confirmed that the pattern is coincident with the crystal structure X-ray diffraction pattern of the homologous phase obtained from the JCPDS (Joint Committee of Powder Diffraction Standards) card or the ICSD (The Inorganic Crystal Structure Database).

As the oxide crystal having a homologous crystal structure, an oxide crystal represented by RAO$_3$(MO)$_m$ can be mentioned. R and A are each a positive trivalent metal element, and as examples thereof, In, Ga, Al, Fe, B or the like can be mentioned, for example. A is a positive trivalent metal element that is different from R, and as examples thereof, Ga, Al, Fe or the like can be mentioned, for example. M is a positive divalent metal element, and as examples thereof, Zn, Mg or the like can be mentioned, for example. In the homologous structure compound represented by InAlO$_3$(ZnO)$_m$ (m is 0.1 to 10) of the invention, R is In, A is Al and M is Zn.

The homologous structure represented by InAlZnO$_4$ shows a peak pattern of No. 40-0258 of JCPDS database or a similar (shifted) pattern.

The homologous structure represented by InAlZn$_2$O$_5$ shows a peak pattern of No. 40-0259 of JCPDS database or a similar (shifted) pattern.

The homologous structure represented by InAlZn$_3$O$_6$ shows a peak pattern of No. 40-0260 of JCPDS database or a similar (shifted) pattern.

The homologous structure represented by InAlZn$_4$O$_7$ shows a peak pattern of 40-0261 of JCPDS database or a similar (shifted) pattern.

The bixbyite structure compound represented by In$_2$O$_3$ can be confirmed by a fact that the peak derived from the bixbyite structure compound is observed by an X-ray diffraction analysis of the target.

The bixbyite structure compound represented by In$_2$O$_3$ shows a peak pattern of No. 06-0416 of JCPDS database or a similar (shifted) pattern.

The bixbyite is also referred to as a C-type rare-earth oxide or Mn$_2$O$_3$ (I) type oxide. As stated in the "Technology of Transparent Conductive Film" (published by Ohmsha Ltd., edited by Japan Society for the Promotion of Science, transparent oxide/photoelectron material 166 committee, 1999) or the like, this compound has a chemical stoichiometric ratio of M$_2$X$_3$ (M is a cation and X is an anion, which is normally an oxygen ion), and one unit cell is formed of 16 M$_2$X$_3$ molecules and 80 atoms in total (the number of M is 32 and the number of X is 48).

The bixbyite structure compound includes a substitutional solid solution in which part of atoms or ions in a crystal structure are replaced by other atoms and an interstitial solid solution in which other atoms are added to a position between lattices.

The sputtering target of the invention preferably does not comprise a spinel structure compound represented by Zn$_2$SnO$_4$.

The spinel structure compound represented by Zn$_2$SnO$_4$ shows a peak pattern of No. 24-1470 of JCPDS database or a similar (shifted) pattern in an X-ray diffraction.

As stated in "Crystal Chemistry" (Mitsuoki Nakahira, Kodansha Ltd., 1973) or the like, the spinel structure normally means AB$_2$X$_4$ type or A$_2$BX$_4$ type structure, and a compound having such a crystal structure is referred to as a spinel structure compound.

In general, in a spinel structure, cations (normally, oxygen) are cubic close-packed, and anions are present in part of the tetrahedral interstitial site or the octahedral interstitial site thereof. A substitutional solid solution in which a part of atoms or ions in a crystal structure are replaced by other atoms and an interstitial solid solution in which other atoms are added to a position between lattices are included in a spinel structure compound.

If the target comprises a spinel structure compound represented by Zn$_2$SnO$_4$ in addition to the homologous structure compound represented by InAlO$_3$(ZnO)$_m$ (m is 0.1 to 10) and a bixbyite structure compound represented by In$_2$O$_3$, the sputtering speed varies depending on the crystal phase since a large amount of different phases are present in the oxide sintered body constituting the target, and hence, parts remaining unremoved may be formed.

In the target of the invention, it is preferred that an indium element, a tin element, a zinc element and an aluminum element satisfy the following formulas (1) to (4):

$$0.10 \leq \text{In}/(\text{In}+\text{Sn}+\text{Zn}+\text{Al}) \leq 0.75 \quad (1)$$

$$0.01 \leq \text{Sn}/(\text{In}+\text{Sn}+\text{Zn}+\text{Al}) \leq 0.30 \quad (2)$$

$$0.10 \leq \text{Zn}/(\text{In}+\text{Sn}+\text{Zn}+\text{Al}) \leq 0.70 \quad (3)$$

$$0.01 \leq \text{Al}/(\text{In}+\text{Sn}+\text{Zn}+\text{Al}) \leq 0.40 \quad (4)$$

wherein in the formula, In, Sn, Zn and Al independently indicate the atomic ratio of each element in the sputtering target.

In the formula (1), if the atomic ratio of In is 0.10 or more, the bulk resistance of the sputtering target does not increase too high, whereby DC sputtering can be conducted without problems. On the other hand, if the atomic ratio of In is 0.75 or less, the homologous structure compound represented by InAlO$_3$(ZnO)$_m$ (m is 0.1 to 10) and the bixbyite structure compound represented by In$_2$O$_3$ tend to be formed easily in the target. If both of the homologous structure compound represented by InAlO$_3$(ZnO)$_m$ (m is 0.1 to 10) and the bixbyite structure compound represented by In$_2$O$_3$ are formed, abnormal grain growth of crystals in the oxide and abnormal discharge caused by the abnormal grain growth can be prevented.

From the above, it is preferred that the atomic ratio of the In element [In/(In+Sn+Zn+Al)] be 0.10 to 0.75, more preferably 0.20 to 0.70, and further preferably 0.25 to 0.70.

In the formula (2) above, if the atomic ratio of the Sn element is 0.01 or more, the density of the oxide sintered body that constitutes the target sufficiently increases, whereby the bulk resistance of the target is lowered. On the other hand, if the atomic ratio of the Sn element is 0.30 or less, $SnO_2$ that causes abnormal discharge to occur is suppressed, whereby abnormal discharge can be prevented.

From the above, the atomic ratio of the Sn element [Sn/(In+Sn+Zn+Al)] is preferably 0.01 to 0.30, more preferably 0.03 to 0.25, and further preferably 0.05 to 0.15.

In the above formula (3), if the atomic ratio of the Zn element is 0.10 or more, the homologous structure compound represented by $InAlO_3(ZnO)_m$ (m is 0.1 to 10) tends to be formed easily. On the other hand, if the atomic ratio of the Zn element is 0.70 or less, ZnO is not deposited easily, and as a result, abnormal discharge caused by ZnO can be prevented.

From the above, the atomic ratio of the Zn element [Zn/(In+Sn+Zn+Al)] is preferably 0.10 to 0.70, more preferably 0.20 to 0.65, and further preferably 0.25 to 0.60.

In the above formula (4), if the atomic ratio of the Al element is 0.01 or more, the homologous structure compound represented by $InAlO_3(ZnO)_m$ (m is 0.1 to 10) tends to be formed easily. On the other hand, if the atomic ratio of the Al element is 0.40 or less, formation of $Al_2O_3$ that causes abnormal discharge to occur is suppressed, whereby occurrence of abnormal discharge can be prevented.

From the above, the atomic ratio of the Al element [Al/(In+Sn+Zn+Al)] is preferably 0.01 to 0.40, more preferably 0.02 to 0.30, and further preferably 0.05 to 0.25.

The atomic ratio of elements contained in the sintered body can be obtained by quantitatively analyzing the elements contained with Induction Coupled Plasma Atomic Emission Spectrometry (ICP-AES).

Specifically, when a solution sample is nebulized using a nebulizer, and introduced into an argon plasma (about 6000 to about 8000° C.), each element contained in the sample absorbs thermal energy, and is excited, and the orbital electrons migrate from the ground state to the orbital at a high energy level. The orbital electrons then migrate to the orbital at a lower energy level when about $10^{-7}$ to about $10^{-8}$ seconds have elapsed. In this case, the difference in energy is emitted as light. Since the emitted light has an element-specific wavelength (spectral line), the presence or absence of each element can be determined based on the presence or absence of the spectral line (qualitative analysis).

Since the size (luminous intensity) of each spectral line is in proportion to the number of each element contained in the sample, the element concentration in the sample can be determined by comparison with a standard solution having a known concentration (quantitative analysis).

After specifying the elements contained in the sample by qualitative analysis, the content of each element is determined by quantitative analysis, and the atomic ratio of each element is calculated from the results.

The sputtering target of the invention may comprise other metal elements than In, Sn, Zn and Al as long as the effects of the invention are not impaired. The sputtering target may consist essentially of In, Sn, Zn and Al or may consist of In, Sn, Zn and Al.

In the invention, the "essentially" means that 95 mass % or more and 100 mass % or less (preferably 98 mass % or more and 100 mass % or less) of the metal element of the sputtering target is In, Sn, Zn and Al. The sputtering target of the invention may contain impurities that are inevitably mixed in in addition to In, Sn, Zn and Al in a range that does not impair the advantageous effects of the invention.

It is preferred that the sputtering target of the invention have a relative density of 98% or more. Particularly, if an oxide semiconductor is deposited on a large-sized substrate (G1 or more) with an increased sputtering output, it is preferred that the relative density be 98% or more.

The relative density is a density which is relatively calculated for the theoretical density which is calculated from the weighted average. The density calculated from the weighted average of the density of each raw material is a theoretical density, which is assumed to be 100%.

If the relative density is 98% or more, stable sputtering state is maintained. When the film is formed by increasing the sputtering power on a large substrate, if the sputtering target has a relative density 98% or more, the target surface is not be blackened easily or abnormal discharge does not occur easily. The relative density is preferably 98.5% or more, with 99% or more being more preferable.

The relative density of the target can be measured by the Archimedian method. The relative density is preferably 100% or less. If the relative density is 100% or less, metal particles are not be generated easily in a sintered body, and formation of a lower oxide is suppressed. Therefore, it is not required to control the oxygen supply amount during film-formation strictly.

Further, the density can be adjusted by a post treatment or the like such as a heat treatment in the reductive atmosphere after sintering. As the reductive atmosphere, an atmosphere such as argon, nitrogen and hydrogen, or an atmosphere of a mixture of these gases can be used.

It is desired that the maximum particle size of the crystal in the oxide constituting the sputtering target be 8 µm or less. Due to the crystal particle size of 8 µm or less, formation of nodules can be suppressed.

When the target surface is ground by sputtering, the grinding speed differs depending on the direction of the crystal, whereby unevenness is generated on the target surface. The size of this unevenness varies depending on the particle size of the crystal present in the sintered body. It is assumed that, in the target formed of a sintered body having a large crystal particle size, a greater scale of unevenness occurs, and nodules are generated from this convex part.

The maximum particle size of the crystal of the sputtering target is obtained as follows. If the sputtering target has a circular shape, at five locations in total, i.e. the central point (one) and the points (four) which are on two central lines crossing orthogonally at this central point and are middle between the central point and the peripheral part, or if the sputtering target has a square shape, at five locations in total, i.e. the central point (one) and middle points (four) between the central point and the corners of the diagonal lines of the square, the maximum diameter is measured for the biggest particle observed within a 100-µm square. The maximum particle size is the average value of the maximum diameters of the biggest particle present in each of the frames defined by the five locations. As for the particle size, the longer diameter of the crystal particle is measured. The crystal particles can be observed by the scanning electron microscopy (SEM).

In the sputtering target of the invention, the bulk specific resistance is preferably 10 mΩcm or less, more preferably 8 mΩcm or less, with 5 mΩcm or less being particularly preferable. The bulk specific resistance can be measured by the method described in the Examples.

As for the relative density and the bulk resistance of the target, the relative density of the target can be 98% or more and the bulk resistance can be 10 mΩcm or less by adjusting the content of the indium (In) element, the tin (Sn) element, the zinc (Zn) element and the aluminum (Al) element to be in the above-mentioned ranges (1) to (4).

The method for producing a sputtering target of the invention comprises the following two steps, for example:
(1) A step in which raw material compounds are mixed and formed to obtain a formed body
(2) A step in which the above-mentioned formed body is sintered Hereinbelow, an explanation will be made based on these steps.

(1) A Step in which Raw Material Compounds are Mixed and Formed to Obtain a Formed Body No specific restrictions are imposed on the raw material compounds, and the raw material compounds may be a simple substance or a compound of In, Sn, Zn and Al. It is preferable to use a simple substance or a compound such that the sintered body can have an atomic ratio shown in the following formulas (1) to (4):

$$0.10 \leq In/(In+Sn+Zn+Al) \leq 0.75 \quad (1)$$

$$0.01 \leq Sn/(In+Sn+Zn+Al) \leq 0.30 \quad (2)$$

$$0.10 \leq Zn/(In+Sn+Zn+Al) \leq 0.70 \quad (3)$$

$$0.01 \leq Al/(In+Sn+Zn+Al) \leq 0.40 \quad (4)$$

wherein In, Sn, Zn and Al independently indicate the atomic ratio of each element in the sputtering target.

A combination of indium oxide, tin oxide, zinc oxide and aluminum metal, a combination of indium oxide, tin oxide, zinc oxide and aluminum oxide or the like can be mentioned. It is preferred that the raw material be powder. It is preferred that the raw material be a mixed powder of indium oxide, tin oxide, zinc oxide and aluminum oxide.

If a simple substance of a metal is used as a raw material; e.g. when a combination of indium oxide, tin oxide, zinc oxide and aluminum metal is used as raw material powders, metal particles of aluminum may be present in the resulting sintered body. As a result, metal particles on the target surface may be molten during film formation and hence may not be emitted from the target, resulting in a great difference between the composition of the film and the composition of the sintered body.

The average particle diameter of the raw material powder is preferably 0.1 μm to 1.2 μm, more preferably 0.1 μm to 1.0 μm. The average particle diameter of the raw material powder can be measured by a laser diffraction particle size distribution measuring apparatus or the like.

For example, $In_2O_3$ powder having an average particle diameter of 0.1 μm to 1.2 μm, $SnO_2$ powder having an average particle diameter of 0.1 μm to 1.2 μm, ZnO powder having an average particle diameter of 0.1 μm to 1.2 μm and $Al_2O_3$ powder having an average particle diameter of 0.1 μm to 1.2 μm are used as the raw material powder. They are mixed in an amount ratio that satisfies the above-mentioned formulas (1) to (4).

In the case of the step (1), the method for forming is not particularly restricted, and a known method can be used. For example, a water-based solvent is added to raw material powders including indium oxide powder, tin oxide powder, zinc oxide powder and aluminum oxide powder, and the resulting slurry is mixed for 12 hours or more. Then, the mixture is subjected to solid-liquid separation, dried and granulated, and the granulated product is then put in a mold and formed.

For the mixing, a wet or dry ball mill, a vibration mill, a beads mill or the like can be used. In order to obtain uniform and fine crystal particles and voids, the most preferable method is a beads mill mixing method since it can pulverize the aggregate efficiently for a short period of time and can realize a favorable dispersed state of additives.

When a ball mill is used for mixing, the mixing time is preferably 15 hours or longer, more preferably 19 hours or longer. If the mixing time is 15 hours or longer, a high-resistant compound such as $Al_2O_3$ may not be generated easily in the oxide sintered body finally obtained. When a beads mill is used for pulverizing and mixing, the mixing time varies depending on the size of the apparatus used and the amount of slurry to be treated. However, the mixing time is controlled appropriately such that the particle distribution in the slurry becomes uniform, i.e. all of the particles have a particle size of 1 μm or less.

It is preferred that an arbitrary amount of a binder be added, and mixing be conducted simultaneously with the addition of the binder. As the binder, polyvinyl alcohol, vinyl acetate or the like can be used.

Subsequently, granulated powder is obtained from a raw material powder slurry. For granulation, it is preferable to use quick dry granulation. As the apparatus for quick dry granulation, a spray dryer is widely used. Specific drying conditions are determined according to conditions such as the concentration of slurry to be dried, the temperature of hot air used for drying and the amount of wind. For actually conducting the quick dry granulation, it is required to obtain optimum conditions in advance.

In the case of quick dry granulation, a homogenous granulated powder can be obtained. That is, separation of $In_2O_3$ powder, $SnO_2$ powder, ZnO powder and $Al_2O_3$ powder due to difference in speed of sedimentation caused by the difference in specific gravity of the raw material powder can be prevented. If a sintered body is made by using uniform granulated powder, abnormal discharge during sputtering due to the presence of $Al_2O_3$ or the like within the sintered body can be prevented.

The granulated powder can normally be formed into a formed body by pressing at a pressure of 1.2 ton/cm$^2$ or more, for example, by means of a mold press or cold isostatic pressing (CIP).

(2) A Step in which the Formed Body is Sintered

The resulting formed body is sintered at 1200 to 1650° C. for 10 to 50 hours to obtain a sintered body. The sintering temperature is preferably 1350 to 1600° C., more preferably 1400 to 1600° C., and further preferably 1450 to 1600° C. The sintering time is preferably 12 to 40 hours, more preferably 13 to 30 hours.

If the sintering temperature is 1200° C. or more and the sintering time is 10 hours or longer, formation of $Al_2O_3$ or the like within the target can be suppressed, whereby abnormal discharge can preferably be prevented. On the other hand, if the calcination temperature is 1650° C. or lower or the calcination time is 50 hours or shorter, an increase in average crystal diameter due to significant crystal particle growth can be prevented. In addition, since generation of large voids can be suppressed, lowering in strength of a sintered body or occurrence of abnormal discharge can preferably be prevented.

As the method of sintering used in the invention, in addition to the pressureless sintering, a pressure sintering method such as hot pressing, oxygen pressurization and hot isostatic pressing or the like can be used. In respect of a decrease in production cost, possibility of mass production and easiness in production of a large-sized sintered body, it is preferable to use pressureless sintering.

In the pressureless sintering, a formed body is sintered in the air or the oxidizing gas atmosphere. Preferably, a formed body is sintered in the oxidizing gas atmosphere. The oxidizing gas atmosphere is preferably an oxygen gas atmosphere. It is preferred that the oxygen gas atmosphere be an atmosphere having an oxygen concentration of 10 to 100 vol %, for example. In the method for producing the sintered body mentioned above, the density of the sintered body can be further increased by introducing an oxygen gas atmosphere during the temperature-elevating step.

As for the temperature-elevating rate at the time of sintering, it is preferred that the temperature-elevating rate be 0.1 to 2.5° C./min in a temperature range of from 800° C. to a sintering temperature (1200 to 1650° C.).

In the sputtering target of an oxide comprising an indium (In) element, a tin (Sn) element, a zinc (Zn) element and an aluminum (Al) element, a temperature range of from 800° C. and higher is a range where sintering proceeds most quickly. If the temperature-elevating rate in this temperature range is 0.1° C./min or more, excessive growth of crystal particles can be prevented, whereby an increase in density can be attained. On the other hand, if the temperature-elevating rate is 2.5° C./min or less, deposition of $Al_2O_3$ or the like within the target can preferably be prevented.

The temperature-elevating rate from 800° C. to a sintering temperature is preferably 0.1 to 2.0° C./min, more preferably 0.1 to 1.5° C./min.

The temperature-decreasing rate (cooling rate) during calcination is normally 10° C./min or less, preferably 9° C./min or less, more preferably 8° C./min or less, further preferably 7° C./min or less, and particularly preferably 5° C./min or less. If the temperature-decreasing rate is 10° C./min or less, the crystal form of the invention can be obtained easily. In addition, cracks hardly occur during temperature decreasing.

In order to allow the bulk resistance of the sintered body obtained in the above-mentioned calcination step to be uniform in the entire target, a reduction step may be further provided, if necessary.

As the reduction method, a reduction treatment by a reductive gas, a reduction treatment by vacuum calcination, a reduction treatment by an inert gas or the like can be given, for example.

In the case of a reduction treatment by a reductive gas, hydrogen, methane, carbon monoxide, or a mixed gas of these gases with oxygen or the like can be used.

In the case of a reduction treatment by calcinating in an inert gas, nitrogen, argon, or a mixed gas of these gases with oxygen or the like can be used.

The temperature at the time of the above-mentioned reduction treatment is normally 100 to 800° C., preferably 200 to 800° C. The reduction treatment is conducted normally for 0.01 to 10 hours, preferably 0.05 to 5 hours.

To sum up, in the method for producing a sintered body used in the invention, a water-based solvent is compounded with raw material powders containing mixed powder of indium oxide power, zinc oxide powder and aluminum oxide powder to obtain a slurry. The obtained slurry is then mixed for 12 hours or longer, and is subjected to solid-liquid separation, dried and granulated. Subsequently, the granulated product is put in a mold and formed. Then, the resulting formed body is sintered at 1200 to 1650° C. for 10 to 50 hours with a temperature-elevating rate in a temperature range of from 800° C. to the sintering temperature being 0.1 to 2.5° C./min and with a temperature-decreasing rate (cooling rate) at the time of calcination being 10° C./min or shorter, whereby the sintered body of the invention can be obtained.

By processing the sintered body obtained above, the sputtering target of the invention can be obtained. Specifically, by grinding the sintered body into a shape suited to be mounted in a sputtering apparatus, a sputtering target (target material) is obtained. If necessary, the sputtering target material may be bonded to a backing plate to obtain a sputtering target.

In order to allow the sintered body to be a target material, the sintered body is ground by means of a surface grinder to allow the surface roughness Ra to be 0.5 µm or less. Further, the sputtering surface of the target material may be subjected to mirror finishing, thereby allowing the average surface roughness thereof Ra to be 1000 Å or less.

For this mirror finishing (polishing), known polishing techniques such as mechanical polishing, chemical polishing, mechano-chemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods.

It is preferable to finish the surface of the target material by means of a #200 to #10,000 diamond wheel, particularly preferably by means of a #400 to #5,000 diamond wheel. If a diamond wheel with a mesh size of #200 to #10,000 is used, breakage of the target material can be prevented.

It is preferred that the surface roughness Ra of the target material be 0.5 µm or less and that the grinding surface have no directivity. If Ra is 0.5 µm or less and the grinding surface has no directivity, occurrence of abnormal discharge or generation of particles can preferably be prevented.

Finally, the thus processed target material is subjected to a cleaning treatment. For cleaning, air blowing, washing with running water or the like can be used. When foreign matters are removed by air blowing, foreign matters can be removed more effectively by air intake by means of a dust collector from the side opposite from the nozzle.

Since the above-mentioned air blow or washing with running water has its limit, ultrasonic cleaning or the like can also be conducted. In ultrasonic cleaning, it is effective to conduct multiplex oscillation within a frequency range of 25 to 300 KHz. For example, it is preferable to perform ultrasonic cleaning by subjecting 12 kinds of frequency composed of every 25 KHz in a frequency range of 25 to 300 KHz to multiplex oscillation.

The thickness of the target material is normally 2 to 20 mm, preferably 3 to 12 mm, and particularly preferably 4 to 6 mm.

By bonding the target material obtained in the manner as mentioned above to a backing plate, a sputtering target can be obtained. A plurality of target materials may be provided in a single backing plate to be used as a substantially single target.

II. Oxide Semiconductor Thin Film

By forming the sputtering target of the invention into a film by a sputtering method, the oxide semiconductor thin film of the invention can be obtained.

The oxide semiconductor thin film of the invention is composed of indium, tin, zinc, aluminum and oxygen and preferably satisfies the following atomic ratios (1) to (4):

$$0.10 \leq In/(In+Sn+Zn+Al) \leq 0.75 \quad (1)$$

$$0.01 \leq Sn/(In+Sn+Zn+Al) \leq 0.30 \quad (2)$$

$$0.10 \leq Zn/(In+Sn+Zn+Al) \leq 0.70 \quad (3)$$

$$0.01 \leq Al/(In+Sn+Zn+Al) \leq 0.40 \quad (4)$$

wherein In, Sn, Zn and Al independently indicate the atomic ratio of each element in the sputtering target.

In the formula (1), if the atomic ratio of the In element is 0.10 or more, the degree of overlapping of the In 5 s orbital can be kept large, and as a result, the field effect mobility may be 10 $cm^2$/Vs or more easily. On the other hand, if the atomic ratio of the In element 0.75 or less, good reliability can be obtained if the formed film is applied to a channel layer of a TFT.

In the formula (2), if the atomic ratio of the Sn element is 0.01 or more, an increase in target resistance can be suppressed, and film formation can be stabilized easily since abnormal discharge hardly occurs during sputtering. On the other hand, if the atomic ratio of the Sn element is 0.30 or less, lowering in solubility of the resulting thin film in a wet etchant can be prevented, whereby wet etching can be conducted without problems.

In the formula (3), if the amount of the Zn element is 0.10 or more, the resulting film can be stable as an amorphous film. On the other hand, if the amount of the Zn element is 0.70 or less, since the dissolution speed of the resulting thin film in a wet etchant is not too high, resulting in smooth wet etching.

In the formula (4), if the atomic ratio of the Al element is 0.01 or more, an increase in the oxygen partial pressure during film formation can be prevented. Since the Al element is bonded to oxygen strongly, it can lower the oxygen partial pressure during film formation. Further, when a channel layer is formed and applied to a TFT, good reliability cab be obtained. On the other hand, if the atomic ratio of the Al element is 0.40 or less, occurrence of abnormal discharge due to formation of $Al_2O_3$ at the time of film formation by sputtering can be prevented, leading to stable film formation.

The carrier concentration of the oxide semiconductor thin film is normally $10^{19}/cm^3$ or less, preferably $10^{13}$ to $10^{18}/cm^3$, further preferably $10^{14}$ to $10^{18}/cm^3$, and particularly preferably $10^{15}$ to $10^{18}/cm^3$.

If the carrier concentration of the oxide layer is $10^{19}$ cm$^{-3}$ or less, it is possible to prevent current leakage, normally-on, lowering in on-off ratio when a device such as a thin film transistor is fabricated. As a result, good transistor performance can be exhibited. Further, if the carrier concentration is $10^{13}$ cm$^{-3}$ or more, the device can be driven as a TFT without causing problems.

The carrier concentration of the oxide semiconductor thin film can be measured by the Hall effect measurement. Specifically, it can be measured by the methods described in the Examples.

Due to a high conductivity, a DC sputtering method having a high film-forming speed can be applied to the sputtering target of the invention.

In addition to the above-mentioned DC sputtering method, the RF sputtering method, the AC sputtering method and the pulse DC sputtering method can be applied to the sputtering target of the invention, and sputtering free from abnormal discharge can be conducted.

The oxide semiconductor thin film can also be formed by using the above-mentioned sintered body by the deposition method, the ion-plating method, the pulse laser deposition method or the like in addition to the sputtering method.

As the sputtering gas (atmosphere) in the production of the oxide semiconductor thin film of the invention, a mixed gas of a rare gas such as argon and an oxidizing gas can be used. Examples of the oxidizing gas include $O_2$, $CO_2$, $O_3$, $H_2O$ and $N_2O$. As the sputtering gas, a mixed gas containing a rare gas, and one or more gases selected from water vapor, an oxygen gas and a nitrous oxide gas is preferable. A mixed gas containing a rare gas and at least water vapor is more preferable.

The oxygen partial pressure ratio at the time of film formation by sputtering is preferably 0% or more and less than 40%. A thin film formed under the conditions in which the oxygen partial pressure ratio is less than 40% may not have a significantly decreased carrier concentration. As a result, it becomes possible to prevent the carrier concentration from being less than $10^{13}$ cm$^{-3}$.

The oxygen partial pressure ratio is preferably 0% to 30% and particularly preferably 0% to 20%.

The partial pressure ratio of water vapor contained in a sputtering gas (atmosphere) at the time of depositing an oxide thin film in the invention, i.e. [$H_2O$]/([$H_2O$]+[rare gas]+[other gases]), is preferably 0.1 to 25%. If the water partial pressure is 25% or less, it is possible to prevent a decrease in film density, and as a result, the degree of overlapping of the In 5s orbital can be kept large, whereby lowering in mobility can be prevented.

The partial pressure ratio of water in the atmosphere at the time of sputtering is more preferably 0.7 to 13%, with 1 to 6% being particularly preferable.

The substrate temperature at the time of film formation by sputtering is preferably 25 to 120° C., further preferably 25 to 100° C., and particularly preferably 25 to 90° C.

If the substrate temperature at the time of film formation is 120° C. or less, oxygen or the like can be incorporated sufficiently at the time of film formation, whereby an excessive increase in carrier concentration of the thin film after heating can be prevented. Further, if the substrate temperature at the time of film formation is 25° C. or more, the denseness of the thin film may not be lowered, and as a result, lowering in mobility of a TFT can be prevented.

It is preferred that the oxide thin film obtained by sputtering be further subjected to an annealing treatment by retaining at 150 to 500° C. for 15 minutes to 5 hours. The annealing treatment temperature after film formation is more preferably 200° C. or more and 450° C. or less, further preferably 250° C. or more and 350° C. or less. By conducting the above-mentioned annealing treatment, semiconductor properties can be obtained.

The heating atmosphere is not particularly restricted. In respect of carrier control properties, the air atmosphere or the oxygen-circulating atmosphere is preferable.

In the annealing treatment as the post treatment of the oxide thin film, in the presence or absence of oxygen, a lamp annealing apparatus, a laser annealing apparatus, a thermal plasma apparatus, a hot air heating apparatus, a contact heating apparatus or the like can be used.

The distance between the target and the substrate at the time of sputtering is preferably 1 to 15 cm in a direction perpendicular to the film-forming surface of the substrate, with 2 to 8 cm being further preferable.

If this distance is 1 cm or more, the kinetic energy of particles of target-constituting elements which arrive at the substrate can be prevented from becoming excessively large, and hence, good film properties can be obtained. Further, in-plane distribution or the like of the film thickness and the electric characteristics can be prevented.

If the distance between the target and the substrate is 15 cm or less, the kinetic energy of particles of target-constituting elements can be prevented from becoming too small, and a dense film may be obtained, and as a result, good semiconductor properties can be obtained.

As for the formation of an oxide thin film, it is desirable that film formation be conducted by sputtering in an atmosphere having a magnetic field intensity of 300 to 1500 gausses. If the magnetic field intensity is 300 gausses or more, since lowering in plasma density can be prevented, sputtering can be conducted without problems even if the sputtering target has a high resistance. On the other hand, if the magnetic field intensity is 1500 gausses or less, deterioration in controllability of the film thickness and the electric characteristics of the film can be suppressed.

No specific restrictions are imposed on the pressure of a gas atmosphere (sputtering pressure), as long as plasma is stably discharged. The pressure is preferably 0.1 to 3.0 Pa, further preferably 0.1 to 1.5 Pa, with 0.1 to 1.0 Pa being particularly preferable. If the sputtering pressure is 3.0 Pa or less, the mean free path of sputtering particles is not shortened excessively, thereby preventing lowering in density of a thin film. If the sputtering pressure is 0.1 Pa or more, fine crystals can be prevented from being formed in a film during film formation.

Meanwhile, the sputtering pressure is the total pressure in the system at the start of sputtering after rare gas atoms (e.g. argon), water molecules, oxygen molecules or the like are introduced.

The formation of an oxide semiconductor thin film may be conducted by the following AC sputtering.

Substrates are transported in sequence to positions opposing to three or more targets arranged in parallel with a prescribed interval in a vacuum chamber. Then, a negative potential and a positive potential are applied alternately from an AC power source to each of the targets, whereby plasma is caused to be generated on the target and a film is formed on the surface of the substrate.

At this time, film formation is conducted by applying at least one output from an AC power source while switching the target to which a potential is applied among two or more targets connected divergently. That is, at least one output from the AC power source is connected divergently to two or more targets respectively, whereby film formation is conducted while applying different potentials to the adjacent targets.

If an oxide semiconductor thin film is formed by AC sputtering, it is preferred that sputtering be conducted in an atmosphere of a mixed gas containing a rare gas, and one or more gases selected from water vapor, an oxygen gas and a nitrous oxide gas, for example. It is particularly preferred that sputtering be conducted in an atmosphere of a mixed gas containing water vapor.

If film formation is conducted by AC sputtering, not only it is possible to obtain an oxide layer which has excellent large-area uniformity on the industrial basis, but also it can be expected that the use efficiency of the target is increased.

If a film is formed by sputtering on a large-area substrate in which the length of one side exceeds 1 m, it is preferable to use an AC sputtering apparatus for producing a large-area film such as that disclosed in JP-A-2005-290550.

The AC sputtering apparatus disclosed in JP-A-2005-290550 specifically has a vacuum chamber, a substrate holder arranged within the vacuum chamber and a sputtering source arranged at a position opposing to this substrate holder. FIG. 1 shows essential parts of a sputtering source of the AC sputtering apparatus. The sputtering source has a plurality of sputtering parts, which respectively have plate-like targets 31a to 31f. Assuming that the surface to be sputtered of each target 31a to 31f is a sputtering surface, the sputtering parts are arranged such that the sputtering surfaces are on the same plane. Targets 31a to 31f are formed in a long and narrow form having a longitudinal direction, and they have the same shape. The targets are arranged such that the edge parts (side surface) in the longitudinal direction of the sputtering surface are arranged in parallel with a prescribed interval therebetween. Accordingly, the side surfaces of the adjacent targets 31a to 31f are in parallel.

Outside the vacuum chamber, AC power sources 17a to 17c are arranged. Among the two terminals of each of AC power sources 17a to 17c, one terminal is connected to one electrode of the adjacent two electrodes, and the other terminal is connected to the other electrode. The two terminals of each AC power source 17a to 17c output voltages differing in polarity (positive and negative), and the targets of 31a to 31f are fitted in close contact with the electrode, whereby, to adjacent two targets 31a to 31f, an alternate voltage differing in polarity is applied from the AC power sources 17a to 17c. Therefore, among the adjacent targets of 31a to 31f, if one is set in a positive potential, the other is set in a negative potential.

On the side opposite to the targets 31a to 31f of the electrode, magnetic field forming means 40a to 40f are arranged. Each magnetic field forming means 40a to 40f has a long and narrow ring-like magnet having an approximately same size as that of the outer circumference of the targets 31a to 31f, and a bar-like magnet which is shorter than the length of the ring-like magnet.

Each ring-like magnet is arranged at the position right behind one corresponding target 31a to 31f such that the ring-like magnets are arranged in parallel with the longitudinal direction of the targets 31a to 31f. As mentioned above, since the targets 31a to 31f are arranged in parallel with a prescribed interval therebetween, the ring-like magnets are arranged with the same interval as that for the targets 31a to 31f from each other.

The AC power density when an oxide target is used in AC sputtering is preferably 3 W/cm$^2$ or more and 20 W/cm$^2$ or less. If the power density is 3 W/cm$^2$ or more, the film-forming speed does not become too slow, and ensures economical advantage in respect of production. A power density of 20 W/cm$^2$ or less can prevent breakage of the target. A more preferable power density is 3 W/cm$^2$ to 15 W/cm$^2$.

The frequency of the AC sputtering is preferably in a range of 10 kHz to 1 MHz. If the frequency is 10 kHz or more, noise problems hardly occur. If the frequency is 1 MHz or less, sputtering in other places than the desired target position due to excessively wide scattering of plasma can be prevented from being conducted, whereby uniformity can be kept. A more preferable AC sputtering frequency is 20 kHz to 500 kHz.

Conditions or the like at the time of sputtering other than those mentioned above may be appropriately selected from the conditions given above.

III. Thin Film Transistor

The above-mentioned oxide semiconductor thin film can be used in a thin film transistor (TFT). It can be used particularly preferably as a channel layer.

No specific restrictions are imposed on the device configuration of the thin film transistor of the invention, as long as it has the above-mentioned oxide thin film as a channel layer. Known various device configurations can be used.

By using the oxide thin film mentioned above as a channel layer of a TFT, a TFT having a high field effect mobility and high reliability can be obtained. The TFT of the invention preferably has a field effect mobility of 10 cm$^2$/Vs or more, more preferably 13 cm$^2$/Vs or more. The field effect mobility can be measured by the method described in the Examples.

The film thickness of the channel layer in the thin film transistor of the invention is normally 10 to 300 nm, preferably 20 to 250 nm, more preferably 30 to 200 nm, further preferably 35 to 120 nm, and particularly preferably 40 to 80 nm. If the film thickness of the channel layer is 10 nm or more, the film thickness does not become non-uniform easily even when the film is formed to have a large area, the properties of a TFT fabricated may become uniform within the plane. If the film thickness is 300 nm or less, the film formation time is not excessively prolonged.

The channel layer in the thin film transistor of the invention is normally used in the N-type region. However, in combination with various P-type semiconductors such as a P-type Si-based semiconductor, a P-type oxide semiconductor and a P-type organic semiconductor, the channel layer can be used in various semiconductor devices such as a PN junction transistor.

In the thin film transistor of the invention, it is preferred that a protective film be provided on the channel layer. It is preferred that the protective film in the thin film transistor of the invention comprise at least SiN$_x$. As compared with SiO$_2$, SiN$_x$ is capable of forming a dense film, and hence has an advantage that it has significant effects of preventing deterioration of a TFT.

The protective film may comprise, in addition to SiNx, an oxide such as SiO$_2$, Al$_2$O$_3$, Ta$_2$O$_5$, TiO$_2$, MgO, ZrO$_2$, CeO$_2$, K$_2$O, Li$_2$O, Na$_2$O, Rb$_2$O, Sc$_2$O$_3$, Y$_2$O$_3$, HfO$_2$, CaHfO$_3$, PbTiO$_3$, BaTa$_2$O$_6$, Sm$_2$O$_3$, SrTiO$_3$ or AlN.

As for the oxide thin film of the invention that comprises an indium (In) element, a tin (Sn) element, a zinc (Zn) element and an aluminum (Al) element, since it contains Al, resistance to reduction by the CVD process is improved. As a result, the back channel side is hardly reduced by a process in which a protective film is prepared, whereby $SiN_x$ can be used as a protective film.

Before forming a protective film, it is preferred that the channel layer be subjected to an ozone treatment, an oxygen plasma treatment, a nitrogen dioxide plasma treatment or a nitrous oxide plasma treatment. Such a treatment may be conducted at any time as long as it is after the formation of a channel layer and before the formation of a protective film. However, it is desirable that the treatment be conducted immediately before the formation of a protective film. By conducting such a pre-treatment, generation of oxygen deficiency in the channel layer can be suppressed.

If hydrogen in the oxide semiconductor film diffuses during driving of a TFT, the threshold voltage may be shifted, resulting in lowering of reliability of a TFT. By subjecting the channel layer to an ozone treatment, an oxygen plasma treatment or a nitrous oxide plasma treatment, the In—OH bonding in the thin film structure is stabilized, whereby diffusion of hydrogen in the oxide semiconductor film can be suppressed.

The thin film transistor normally comprises a substrate, a gate electrode, a gate insulating layer, an organic semiconductor layer (channel layer), a source electrode and a drain electrode. The channel layer is as mentioned above. A known material can be used for the substrate.

No particular restrictions are imposed on the material forming the gate insulating film in the thin film transistor of the invention. A material which is generally used can be arbitrarily selected. Specifically, a compound such as $SiO_2$, $SiN_x$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $SrTiO_3$, $Sm_2O_3$, AlN or the like can be used, for example. Among these, $SiO_2$, $SiN_x$, $Al_2O_3$, $Y_2O_3$, $HfO_2$ and $CaHfO_3$ are preferable, with $SiO_2$, $SiN_x$, $HfO_2$ and $Al_2O_3$ being more preferable.

The gate insulating film can be formed by the plasma CVD (Chemical Vapor Deposition) method, for example.

If a gate insulating film is formed by the plasma CVD method and a channel layer is formed thereon, hydrogen in the gate insulating film diffuses in the channel layer, and as a result, deterioration of film quality of the channel layer or lowering of reliability of a TFT may be caused. In order to prevent deterioration of film quality of the channel layer or lowering of reliability of a TFT, it is preferred that the gate insulating film be subjected to an ozone treatment, an oxygen plasma treatment, a nitrogen dioxide plasma treatment or a nitrous oxide plasma treatment before the formation of a channel layer. By conducting such a pre-treatment, deterioration of film quality of the channel layer or lowering of reliability of a TFT can be prevented.

The number of oxygen atoms of these oxides does not necessarily coincide with the stoichiometric ratio. For example, $SiO_2$ or $SiO_x$ may be used.

The gate insulting film may have a structure in which two or more insulating films composed of different materials are stacked. The gate insulating film may be crystalline, polycrystalline, or amorphous. The gate insulating film is preferably polycrystalline or amorphous from the viewpoint of easiness of industrial production.

No specific restrictions are imposed on the material forming each electrode in the thin film transistor, i.e. a drain electrode, a source electrode and a gate electrode, and materials which are generally used can be arbitrarily selected. For example, transparent electrodes such as ITO, IZO, ZnO, $SnO_2$ or the like, a metal electrode such as Al, Ag, Cu, Cr, Ni, Mo, Au, Ti, and Ta or an alloy metal electrode containing these metals can be used.

Each of the drain electrode, the source electrode and the gate electrode may have a multi-layer structure in which two or more different conductive layers are stacked. In particular, since the source/drain electrodes are required to be used in low-resistance wiring, the electrodes may be used by sandwiching a good conductor such as Al and Cu between metals having good adhesiveness such as Ti and Mo.

The thin film transistor of the invention can be applied to various integrated circuits such as a field effect transistor, a logical circuit, a memory circuit and a differential amplifier circuit. Further, in addition to a field effect transistor, it can be applied to a static induction transistor, a Schottky barrier transistor, a Schottky diode and a resistance element.

As for the configuration of the thin film transistor of the invention, a known configuration such as a bottom-gate configuration, a bottom-contact configuration and a top-contact configuration can be used without restrictions.

In particular, a bottom-gate configuration is advantageous since high performance can be obtained as compared with a thin film transistor comprising amorphous silicon or ZnO. The bottom-gate configuration is preferable since the number of masks at the time of production can be decreased easily and the production cost for application such as a large-sized display or the like can be reduced easily.

The thin film transistor of the invention can preferably be used as a display.

For use in a large-sized display, a channel-etch type bottom-gate thin film transistor is particularly preferable. A channel-etch type bottom-gate thin film transistor can produce a panel for a display at a low cost since the number of photo-masks used in photolithography is small. Among these, a channel-etch type thin film transistor having a bottom-gate configuration and a channel-etch type thin film transistor having a top-contact configuration are particularly preferable since they have excellent properties such as mobility and can be industrialized easily.

EXAMPLES

Examples 1 to 6

[Production of Oxide Sintered Body]

As raw material powders, the following oxide powders were used. The median size D50 was employed as an average particle size for the following oxide powders. The average particle size was measured by a laser diffraction particle size analyzer SALD-300V (manufactured by Shimadzu Corporation).

Indium oxide powder: average particle size 0.98 μm

Tin oxide powder: average particle size 0.98 μm

Zinc oxide powder: average particle size 0.96 μm

Aluminum oxide powder: average particle size 0.98 μm

The above-mentioned powders were weighed such that the atomic ratio shown in Table 1 was attained. They were finely pulverized and mixed uniformly and then granulated by adding a binder for forming. Subsequently, the mixed powder of the raw materials was filled in the mold uniformly and press-formed at a pressing pressure of 140 MPa in a cold press apparatus.

The formed body obtained was sintered in a sintering furnace at a temperature-elevating rate (from 800° C. to the sintering temperature), a sintering temperature, a sintering time and a temperature-decreasing rate shown in Table 1 to produce a sintered body. During the temperature elevation, the atmosphere was oxygen, and otherwise air (atmosphere).

TABLE 1

| | Ratio of metal element (X) [X/(In + Sn + Zn + Al)] | | | | Temperature-elevating rate [° C./min] (from 800° C. to sintering temperature) | Sintering temperature [° C.] | Sintering time [hr] | Temperature-decreasing rate (cooling rate) [° C./min] |
|---|---|---|---|---|---|---|---|---|
| | X = In | X = Sn | X = Zn | X = Al | | | | |
| Ex. 1 | 0.50 | 0.15 | 0.25 | 0.10 | 0.60 | 1450 | 20 | 10 |
| Ex. 2 | 0.70 | 0.05 | 0.20 | 0.05 | 0.60 | 1450 | 20 | 10 |
| Ex. 3 | 0.50 | 0.10 | 0.30 | 0.10 | 0.60 | 1450 | 20 | 10 |
| Ex. 4 | 0.50 | 0.05 | 0.35 | 0.10 | 0.60 | 1450 | 20 | 10 |
| Ex. 5 | 0.50 | 0.10 | 0.30 | 0.10 | 0.10 | 1470 | 20 | 8 |
| Ex. 6 | 0.50 | 0.05 | 0.35 | 0.10 | 0.10 | 1470 | 20 | 8 |
| Comp. Ex. 1 | 0.85 | 0.10 | 0.045 | 0.005 | 5.5 | 1150 | 8 | 15 |
| Comp. Ex. 2 | 0.80 | 0.13 | 0.065 | 0.005 | 5.5 | 1150 | 8 | 15 |

[Analysis of Sintered Body]

The relative density of the sintered body obtained was measured by the Archimedean method. The sintered bodies of Examples 1 to 6 were confirmed to have a relative density of 98% or more.

Further, the bulk specific resistance (conductivity) of the sintered body obtained was measured by means of a resistivity meter (Loresta, manufactured by Mitsubishi Chemical Analytech Co., Ltd.) in accordance with the four point probe method (JIS R 1637). The results are shown in Table 1. As shown in Table 1, the bulk specific resistances of the sintered bodies of Examples 1 to 6 were 10 mΩcm or less.

For the sintered bodies obtained, ICP-AES analysis was conducted. As a result, they were confirmed to have the atomic ratios shown in Table 1.

Moreover, the crystal structure of each of the sintered body obtained was determined by means of an X-ray diffraction (XRD) apparatus. X-ray diffraction charts of the sintered bodies obtained in Examples 1 to 6 are shown in FIGS. 2 to 7, respectively.

The formed compounds contained in the sintered body (crystal structure of the oxide) are shown in Table 2.

As a result of analyzing the chart, a homologous structure of $InAlZnO_4$ and a bixbyite structure of $In_2O_3$ were observed in the sintered body of Example 1. The crystal structure was confirmed by using JCPDS cards and ICSD.

The homologous structure represented by $InAlZnO_4$ has a peak pattern of No. 40-0258 of the JCPDS database. The bixbyite structure represented by $In_2O_3$ has a peak pattern of No. 06-0416 of the JCPDS data base.

In the sintered body of Example 2, the homologous structure represented by $InAlZn_2O_5$ and the bixbyite structure represented by $In_2O_3$ were observed. The homologous structure represented by $InAlZn_2O_5$ has a peak pattern of No. 40-0259 of the JCPDS data base.

In the sintered body of Example 3, the homologous structure represented by $InAlZn_2O_5$, the homologous structure represented by $InAlZnO_4$ and the bixbyite structure represented by $In_2O_3$ were observed.

In the sintered body of Example 4, the homologous structure represented by $InAlZn_2O_5$ and the bixbyite structure represented by $In_2O_3$ were observed.

In the sintered body of Example 5, the homologous structure represented by $InAlZn_2O_5$, the homologous structure represented by $InAlZnO_4$ and the bixbyite structure represented by $In_2O_3$ were observed.

In the sintered body of Example 6, the homologous structure represented by $InAlZn_2O_5$ and the bixbyite structure represented by $In_2O_3$ were observed.

The spinel structure represented by $Zn_2SnO_4$ was not observed in the sintered bodies of Examples 1 to 6.

The X-ray diffraction measurement (XRD) was measured under the following conditions.

Apparatus: Ultima-III manufactured by Rigaku Corporation

X-ray: Cu—Kα rays (wavelength 1.5406 Å, monochromatized with a graphite monochromator)

2θ-θ reflection method, continuous scanning (1.0°/min)

sampling interval: 0.02° slits DS, SS: ⅔°, RS: 0.6 mm

TABLE 2

| | Compounds formed in sintered body | Relative density [%] | Bulk specific resistance [mΩcm] | Occurrence of abnormal discharge during sputtering | Number of nodules generated [number/3 mm$^2$] |
|---|---|---|---|---|---|
| Example 1 | $InAlZnO_4$, $In_2O_3$ | 99.5 | 1.5 | None | 0 |
| Example 2 | $InAlZn_2O_5$, $In_2O_3$ | 98.9 | 3.3 | None | 0 |
| Example 3 | $InAlZn_2O_5$, $InAlZnO_4$, $In_2O_3$ | 99.2 | 2.8 | None | 0 |
| Example 4 | $InAlZn_2O_5$, $In_2O_3$ | 99.0 | 2.3 | None | 0 |
| Example 5 | $InAlZn_2O_5$, $InAlZnO_4$, $In_2O_3$ | 99.9 | 1.0 | None | 0 |
| Example 6 | $InAlZn_2O_5$, $In_2O_3$ | 99.9 | 1.2 | None | 0 |
| Comp. Ex. 1 | $In_2O_3$, $Zn_2SnO_4$ | 95.2 | 18.5 | Micro arc generated | 15 |
| Comp. Ex. 2 | $In_2O_3$, $Zn_2SnO_4$ | 96.8 | 20.9 | Micro arc generated | 27 |

For the sintered bodies of Examples 1 to 6, the dispersion of Sn or Al in the sintered body obtained by the electron probe microanalyzer (EPMA) measurement was checked. An 8 μm or larger-sized aggregation of Sn or Al was not observed. As a result, the sputtering targets of the invention were found to be significantly excellent in dispersivity and homogeneousness. The EPMA measurement was conducted under the following conditions.

Apparatus: JXA-8200 (JEOL Ltd.)

Accelerating voltage: 15 kV

Irradiation current: 50 nA

Irradiation time (per one point): 50 mS

[Production of Sputtering Target]

The surface of the sintered bodies obtained in Examples 1 to 6 was ground by means of a surface grinder. The sides thereof were cut using a diamond cutter. The sintered bodies were bonded to a backing plate, thereby to obtain sputtering targets each having a diameter of 4 inches. Further, in Examples 1, 3 and 4, targets each having a width of 200 mm, a length of 1700 mm and a thickness of 10 mm were fabricated for AC sputtering film-forming (Examples 13 to 15, mentioned later).

[Confirmation of Presence or Absence of Abnormal Discharge]

A sputtering target having a diameter of 4 inches obtained was mounted in a DC sputtering apparatus. As the atmosphere, a mixed gas obtained by adding a $H_2O$ gas to an argon gas at a partial pressure ratio of 2% was used. A 10 kWh continuous sputtering was conducted at a DC power of 400 W with the sputtering pressure being 0.4 Pa and the substrate temperature being room temperature. Variations in voltage during the sputtering were stored in data logger to confirm the presence or absence of abnormal discharge. The results are shown in Table 2.

The above-mentioned presence or absence of abnormal discharge was determined by detecting abnormal discharge while monitoring variations in voltage. Specifically, "abnormal discharge" is defined by the case where the voltage variation generated for a measurement time of 5 minutes is 10% or more of the working voltage during sputtering operation. In particular, when the working voltage during a sputtering operation varies within a range of ±10% for 0.1 second, micro arcs, which are abnormal discharge of sputtering discharge, may generate, thereby lowering the yield of a device. Accordingly, they may be unsuitable for mass production.

[Confirmation of Presence or Absence of Nodule Generation]

Sputtering was conducted continuously for 40 hours by using a 4-inch-diameter sputtering target obtained with the atmosphere being a mixed gas obtained by adding a hydrogen gas to an argon gas at a partial pressure ratio of 3% to confirm the presence or absence of nodule generation. As a result, on the surface of sputtering targets of Examples 1 to 6, no nodules were observed.

The conditions at the time of the sputtering include a sputtering pressure of 0.4 Pa, a DC power of 100 W and a substrate temperature of room temperature. The hydrogen gas was added to the atmosphere gas in order to promote nodule generation.

For evaluation of nodules, the following method was employed. The change in the target surface after sputtering was observed at a magnification of 50 times by means of a stereomicroscope. The number average of nodules having a size of 20 μm or larger generated in the visual field of 3 mm$^2$ was calculated. Table 2 shows the number of nodules generated.

Comparative Examples 1 and 2

Sintered bodies and sputtering targets were produced and evaluated in the same manner as in Example 1, except that the raw material powders were mixed according to the atomic ratio shown in Table 1, and sintered at a temperature-elevating rate (from 800° C. to the sintering temperature), at a sintering temperature, for a sintering time shown in Table 1 and at a temperature-decreasing rate of 15° C./min. The results are shown in Tables 1 and 2.

In the targets of Comparative Examples 1 and 2, the homologous structure compound represented by $InAlO_3(ZnO)_m$ (m is 0.1 to 10) was not observed, and the bixbyite structure represented by $In_2O_3$ and the spinel structure represented by $Zn_2SnO_4$ were observed. The spinel structure represented by $Zn_2SnO_4$ has a peak pattern of No. 24-1470 of the JCPDS card.

In the sputtering targets of Comparative Examples 1 and 2, abnormal discharge occurred during sputtering, and nodules were observed on the target surface.

It was revealed that, in the sintered bodies of Comparative Examples 1 and 2, since both of the homologous structure compound represented by $InAlO_3(ZnO)_m$ (m is 0.1 to 10) and the bixbyite structure represented by $In_2O_3$ were not formed, the densities of the sintered bodies were lowered, resulting in an increase in bulk resistance. It can be considered that nodules were generated due to such an increase in bulk resistance.

Examples 7 to 12

[Production of Oxide Semiconductor Thin Film]

The 4-inch targets produced in Examples 1 to 6 and having the compositions shown in Table 3 or 4 were mounted in a magnetron sputtering apparatus, and slide glass (#1737, manufactured by Corning Inc.) was installed as a substrate in each case. By the DC magnetron sputtering method, a 50 nm-thick amorphous film was formed on the slide glass under the following conditions. At the time of film formation, an Ar gas, an $O_2$ gas and a $H_2O$ gas were introduced at partial pressure ratios (%) shown in Table 3 or 4. The substrate on which an amorphous film had been formed was heated in an atmosphere at 300° C. for 60 minutes.

Sputtering conditions were as follows.
Substrate temperature: 80° C.
Ultimate pressure: 8.5×10$^{-5}$ Pa
Atmospheric gas: Ar gas, $O_2$ gas, $H_2O$ gas (for partial pressure, see Tables 3 and 4)
Sputtering pressure (total pressure): 0.4 Pa
Input power: DC 100 W
S (substrate)-T (target) distance: 70 mm

TABLE 3

| | | Example 7 | Example 8 | Example 9 | Example 10 |
|---|---|---|---|---|---|
| Target composition | | In/(In + Sn + Zn + Al) = 0.50<br>Sn/(In + Sn + Zn + Al) = 0.15<br>Zn/(In + Sn + Zn + Al) = 0.25<br>Al/(In + Sn + Zn + Al) = 0.10 | In/(In + Sn + Zn + Al) = 0.70<br>Sn/(In + Sn + Zn + Al) = 0.05<br>Zn/(In + Sn + Zn + Al) = 0.20<br>Al/(In + Sn + Zn + Al) = 0.05 | In/(In + Sn + Zn + Al) = 0.50<br>Sn/(In + Sn + Zn + Al) = 0.10<br>Zn/(In + Sn + Zn + Al) = 0.30<br>Al/(In + Sn + Zn + Al) = 0.10 | In/(In + Sn + Zn + Al) = 0.50<br>Sn/(In + Sn + Zn + Al) = 0.05<br>Zn/(In + Sn + Zn + Al) = 0.35<br>Al/(In + Sn + Zn + Al) = 0.10 |
| Sputtering conditions | Ultimate pressure (Pa) | 8.5 × 10$^{-5}$ | 8.5 × 10$^{-5}$ | 8.5 × 10$^{-5}$ | 8.5 × 10$^{-5}$ |
| | Sputtering pressure (Pa) | 0.4 | 0.4 | 0.4 | 0.4 |
| | [H$_2$O]/([H$_2$O] + [Ar] + [O$_2$]) (%) | 0 | 2 | 1 | 0 |
| | [Ar]/([H$_2$O] + [Ar] + [O$_2$]) (%) | 85 | 78 | 94 | 75 |

TABLE 3-continued

|  |  | Example 7 | Example 8 | Example 9 | Example 10 |
|---|---|---|---|---|---|
|  | Target composition | In/(In + Sn + Zn + Al) = 0.50<br>Sn/(In + Sn + Zn + Al) = 0.15<br>Zn/(In + Sn + Zn + Al) = 0.25<br>Al/(In + Sn + Zn + Al) = 0.10 | In/(In + Sn + Zn + Al) = 0.70<br>Sn/(In + Sn + Zn + Al) = 0.05<br>Zn/(In + Sn + Zn + Al) = 0.20<br>Al/(In + Sn + Zn + Al) = 0.05 | In/(In + Sn + Zn + Al) = 0.50<br>Sn/(In + Sn + Zn + Al) = 0.10<br>Zn/(In + Sn + Zn + Al) = 0.30<br>Al/(In + Sn + Zn + Al) = 0.10 | In/(In + Sn + Zn + Al) = 0.50<br>Sn/(In + Sn + Zn + Al) = 0.05<br>Zn/(In + Sn + Zn + Al) = 0.35<br>Al/(In + Sn + Zn + Al) = 0.10 |
|  | $[O_2]/([H_2O] + [Ar] + [O_2])$ (%) | 15 | 20 | 5 | 25 |
|  | Water partial pressure (Pa) | 0.0E+00 | 8.0E−03 | 4.0E−03 | 0.0E+00 |
|  | Sputtering method | DC | DC | DC | DC |
|  | T-S distance (mm) | 70 | 70 | 70 | 70 |
|  | Film thickness (nm) | 50 | 50 | 50 | 50 |
|  | Substrate temperature (° C.) | 80 | 80 | 80 | 80 |
| Annealing | Annealing temperature (° C.) | 300 | 300 | 300 | 300 |
|  | Annealing time (min) | 60 | 60 | 60 | 60 |
|  | Atmosphere | Air | Air | Air | Air |
| Hall measurement | Carrier concentration (cm$^{-3}$) | 5.68E+17 | 3.05E+17 | 3.29E+17 | 6.91E+17 |
| TFT | Channel width/ Channel length (μm) | 20/10 | 20/10 | 20/10 | 20/10 |
|  | Source/drain | Mo | Mo | Mo | Mo |
|  | Source/drain patterning | Lift off | Lift off | Lift off | Lift off |
|  | Channel treatment before forming of protective film | Nitrous oxide plasma | Nitrous oxide plasma | Nitrous oxide plasma | Nitrous oxide plasma |
|  | Protective film | SiOx/SiNx | SiOx/SiNx | SiOx/SiNx | SiOx/SiNx |
|  | Mobility (cm$^2$/Vs) | 17.5 | 14.9 | 17.0 | 20.3 |
|  | Threshold voltage Vth (V) | 1.8 | 0.26 | 1.5 | 0.17 |
|  | S value (V/dec) | 0.16 | 0.21 | 0.12 | 0.20 |
|  | Threshold voltage shift ΔVth(V) | 0.19 | 0.27 | 0.18 | 0.22 |

TABLE 4

|  |  | Example 11 | Example 12 | Comp. Ex. 3 | Comp. Ex. 4 |
|---|---|---|---|---|---|
|  | Target composition | In/(In + Sn + Zn + Al) = 0.50<br>Sn/(In + Sn + Zn + Al) = 0.10<br>Zn/(In + Sn + Zn + Al) = 0.30<br>Al/(In + Sn + Zn + Al) = 0.10 | In/(In + Sn + Zn + Al) = 0.50<br>Sn/(In + Sn + Zn + Al) = 0.05<br>Zn/(In + Sn + Zn + Al) = 0.35<br>Al/(In + Sn + Zn + Al) = 0.10 | In/(In + Sn + Zn + Al) = 0.85<br>Sn/(In + Sn + Zn + Al) = 0.10<br>Zn/(In + Sn + Zn + Al) = 0.045<br>Al/(In + Sn + Zn + Al) = 0.005 | In/(In + Sn + Zn + Al) = 0.80<br>Sn/(In + Sn + Zn + Al) = 0.13<br>Zn/(In + Sn + Zn + Al) = 0.065<br>Al/(In + Sn + Zn + Al) = 0.005 |
| Sputtering conditions | Ultimate pressure (Pa) | 8.5 × 10$^{-5}$ | 8.5 × 10$^{-5}$ | 8.5 × 10$^{-5}$ | 8.5 × 10$^{-5}$ |
|  | Sputtering pressure (Pa) | 0.4 | 0.4 | 0.4 | 0.4 |
|  | $[H_2O]/([H_2O] + [Ar] + [O_2])$ (%) | 0 | 2 | 0 | 0 |
|  | $[Ar]/([H_2O] + [Ar] + [O_2])$ (%) | 70 | 98 | 50 | 50 |
|  | $[O_2]/([H_2O] + [Ar] + [O_2])$ (%) | 30 | 0 | 50 | 50 |
|  | Water partial pressure (Pa) | 0.0E+00 | 8.0E−03 | 0.0E+00 | 0.0E+00 |
|  | Sputtering method | DC | DC | DC | DC |
|  | T-S distance (mm) | 70 | 70 | 70 | 70 |
|  | Film thickness (nm) | 50 | 50 | 50 | 50 |
|  | Substrate temperature (° C.) | 80 | 80 | 80 | 80 |
| Annealing | Annealing temperature (° C.) | 300 | 300 | 300 | 300 |
|  | Annealing time (min) | 60 | 60 | 60 | 60 |
|  | Atmosphere | Air | Air | Air | Air |

TABLE 4-continued

|  |  | Example 11 | Example 12 | Comp. Ex. 3 | Comp. Ex. 4 |
|---|---|---|---|---|---|
|  | Target composition | In/(In + Sn + Zn + Al) = 0.50<br>Sn/(In + Sn + Zn + Al) = 0.10<br>Zn/(In + Sn + Zn + Al) = 0.30<br>Al/(In + Sn + Zn + Al) = 0.10 | In/(In + Sn + Zn + Al) = 0.50<br>Sn/(In + Sn + Zn + Al) = 0.05<br>Zn/(In + Sn + Zn + Al) = 0.35<br>Al/(In + Sn + Zn + Al) = 0.10 | In/(In + Sn + Zn + Al) = 0.85<br>Sn/(In + Sn + Zn + Al) = 0.10<br>Zn/(In + Sn + Zn + Al) = 0.045<br>Al/(In + Sn + Zn + Al) = 0.005 | In/(In + Sn + Zn + Al) = 0.80<br>Sn/(In + Sn + Zn + Al) = 0.13<br>Zn/(In + Sn + Zn + Al) = 0.065<br>Al/(In + Sn + Zn + Al) = 0.005 |
| Hall measurement | Carrier concentration ($cm^{-3}$) | 5.80E+17 | 5.02E+17 | 5.39E+18 | 4.93E+18 |
| TFT | Channel width/Channel length (μm) | 20/10 | 20/10 | 20/10 | 20/10 |
|  | Source/drain | Mo | Mo | Mo | Mo |
|  | Source/drain patterning | Lift off | Lift off | Lift off | Lift off |
|  | Channel treatment before forming protective film | Nitrous oxide plasma | Nitrous oxide plasma | No treatment | No treatment |
|  | Protective film | SiOx/SiNx | SiOx/SiNx | SiOx/SiNx | SiOx/SiNx |
|  | Mobility ($cm^2/Vs$) | 23.2 | 20.2 | 28.5 | 30.8 |
|  | Threshold voltage Vth (V) | 0.35 | 0.96 | −12 | −10 |
|  | S value (V/dec) | 0.12 | 0.17 | 0.55 | 0.47 |
|  | Threshold voltage shift ΔVth (V) | 0.18 | 0.23 | 4.9 | 4.1 |

[Evaluation of Oxide Semiconductor Thin Film]

A glass substrate on which an oxide semiconductor film had been formed was set in a Resi Test 8300 (manufactured by TOYO Corporation), and the Hall effect was evaluated at room temperature. Specifically, a carrier concentration was determined. The results are shown in Tables 3 and 4.

Further, by the ICP-AES analysis, it was confirmed that the atomic ratio of each element contained in the oxide thin film was the same as that of the sputtering target.

The crystal structure of the oxide thin film formed on the glass substrate was examined by means of an X-ray diffraction measurement apparatus (Ultima-III, manufactured by Rigaku Corporation). In Examples 7 to 12, no diffraction peaks were observed immediately after the deposition of the thin film, and hence it was confirmed that the thin film was amorphous. After conducting a heat treatment (annealing) in the air at 300° C. for 60 minutes, no diffraction peaks were observed, and the thin film was confirmed to be amorphous.

The measuring conditions of the XRD are as follows.
Apparatus: Ultima-III, manufactured by Rigaku Corporation
X ray: Cu—Kα rays (wavelength: 1.5406 Å, monochromatized by means of a graphite monochrometer)
2θ-θ reflection method, continuous scanning (1.0°/min)
Sampling interval: 0.02°
Slit DS, SS: ⅔°, RS: 0.6 mm

[Production of Thin Film Transistor]

As a substrate, a conductive silicon substrate provided with a 100 nm-thick thermally oxidized film was used. The thermally oxidized film functioned as a gate insulating film and the conductive silicon part functioned as a gate electrode.

On the gate insulating film, a film was formed by sputtering under the conditions shown in Tables 3 and 4, whereby a 50 nm-thick amorphous thin film was formed. As a resist, OFPR #800 (manufactured by Tokyo Ohka Kogyo Co., Ltd.) was used. Coating, pre-baking (80° C., 5 minutes) and exposure were conducted. After development, post-baking (120° C., 5 minutes), etching with oxalic acid, and patterning into a desired shape were conducted. Thereafter, the film was subjected to a heat treatment at 300° C. for 60 minutes in a hot-air oven (annealing treatment).

Thereafter, Mo (100 nm) was formed into a film by sputtering, and source/drain electrodes were patterned by the lift-off method in a desired shape. As shown in Tables 3 and 4, as a pre-treatment before forming a protective film, an oxide semiconductor film was subjected to a nitrous oxide plasma treatment. Further, $SiO_x$ was formed into a film having a thickness of 100 nm by the plasma CVD (PECVD) method and $SiN_x$ was formed on the $SiO_x$ film in a thickness of 150 nm by the plasma CVD (PECVD) method to obtain a protective film. A contact hole was formed by dry etching, whereby a thin film transistor was fabricated.

[Evaluation of Thin Film Transistor]

For the thus fabricated thin film transistor, a field effect mobility (μ), an S value and a threshold voltage (Vth) were evaluated. These characteristic values were measured by using a semiconductor parameter analyzer (4200SCS, manufactured by Keithley Instruments, Inc.) at room temperature in a light-shielding environment (in a shield box).

For the produced transistor, transfer characteristics were evaluated with the drain voltage (Vd) and the gate voltage (Vg) being 1V and −15 to 20V, respectively. The results are shown in Tables 3 and 4. The field effect mobility (μ) was calculated from the linear mobility, and defined as the maximum value of Vg-μ.

For the fabricated thin film transistor, a DC bias stress test was conducted. Tables 3 and 4 show a change in TFT transfer characteristics before and after application of a DC stress of Vg=15V and Vd=15V (stress temperature: 80° C. or less) for 10000 seconds.

It was revealed that the thin film transistor in Examples 7 to 12 suffered only a slight change in threshold voltage, i.e. it was hardly affected by a DC stress.

Comparative Examples 3 and 4

By using the 4-inch targets fabricated in Comparative Examples 1 and 2, oxide semiconductor thin films and thin film transistors were fabricated and evaluated in the same manner as in Examples 7 to 12 in accordance with the sputtering conditions, heating (annealing) conditions and a pre-treatment for forming a protective film shown in Table 4. The results are shown in Table 4.

As shown in Table 4, in the devices in Comparative Examples 3 and 4, the threshold voltage was negative. As a result of a stress test, in the thin film transistors of Comparative Examples 3 and 4, the threshold voltage varied by 1V or more, revealing that significant deterioration in characteristics occurred.

Examples 13 to 15

By using the film-forming apparatus disclosed in JP-A-2005-290550 and in accordance with the conditions shown in Table 5, AC sputtering was conducted. Oxide sintered bodies and thin film transistors were fabricated in the same manner as in Examples 7 to 12, except that an amorphous film was formed under the following conditions and the source/drain patterning was conducted by dry etching. The results are shown in Table 5.

As a result of the ICP-AES analysis of the oxide semiconductor thin film, it was confirmed that the atomic ratio of each element contained in the oxide thin film was the same as that of the sputtering target.

The AC sputtering was specifically conducted as follows by using the apparatus shown in FIG. 1.

6 targets 31a to 31f (each having a width of 200 mm, a length of 1700 mm and a thickness of 10 mm) fabricated in Example 1, 3 or 4 were used. These targets 31a to 31f were arranged in parallel to the direction of the width of a substrate such that they remote from each other with an interval of 2 mm. The width of the magnetic field forming means 40a to 40f was 200 mm as in the case of targets 31a to 31f. From the gas supply system, Ar, $H_2O$ and/or $O_2$ as the sputtering gas were respectively introduced into the system.

The sputtering conditions for Example 13, for example, were as follows. Film-forming atmosphere: 0.5 Pa, AC source power density: 3 W/cm$^2$ (=10.2 kW/3400 cm$^2$), and frequency: 10 kHz.

In order to examine the film-forming speed, under the above-mentioned conditions, film formation was conducted for 10 seconds. The film thickness of the resulting thin film was measured and found to be 13 nm. The film formation speed was as high as 78 nm/min, which is suited to mass production.

The glass substrate on which a thin film had been formed was put in an electric furnace, and subjected to a heat treatment in the air at 300° C. for 60 minutes (in the air atmosphere). The thin film was cut into a size of 1 cm$^2$, and then subjected to the Hall measurement by the four point probe method. As a result, the carrier concentration was $4.83 \times 10^{17}$ cm$^{-3}$, indicating that the film became a sufficient semiconductor.

As a result of an XRD measurement, it was confirmed that the oxide thin film was amorphous immediately after the thin film deposition, and was still amorphous after allowing it to stand in the air at 300° C. for 60 minutes.

TABLE 5

| | Target composition | Example 13<br>In/(In + Sn + Zn + Al) = 0.50<br>Sn/(In + Sn + Zn + Al) = 0.15<br>Zn/(In + Sn + Zn + Al) = 0.25<br>Al/(In + Sn + Zn + Al) = 0.10 | Example 14<br>In/(In + Sn + Zn + Al) = 0.50<br>Sn/(In + Sn + Zn + Al) = 0.10<br>Zn/(In + Sn + Zn + Al) = 0.30<br>Al/(In + Sn + Zn + Al) = 0.10 | Example 15<br>In/(In + Sn + Zn + Al) = 0.50<br>Sn/(In + Sn + Zn + Al) = 0.05<br>Zn/(In + Sn + Zn + Al) = 0.35<br>Al/(In + Sn + Zn + Al) = 0.10 |
|---|---|---|---|---|
| Sputtering conditions | Ultimate pressure (Pa) | $5.0 \times 10^{-5}$ | $5.0 \times 10^{-5}$ | $5.0 \times 10^{-5}$ |
| | Sputtering pressure (Pa) | 0.5 | 0.5 | 0.5 |
| | $[H_2O]/([H_2O] + [Ar] + [O_2])$ (%) | 0 | 1 | 1 |
| | $[Ar]/([H_2O] + [Ar] + [O_2])$ (%) | 80 | 89 | 89 |
| | $[O_2]/([H_2O] + [Ar] + [O_2])$ (%) | 20 | 10 | 10 |
| | Water partial pressure (Pa) | 0 | 0.005 | 0.005 |
| | Sputtering method | AC | AC | AC |
| | AC power density (W/cm$^2$) | 3 | 5 | 5 |
| | AC frequency (Hz) | 10k | 20k | 500k |
| | Film thickness (nm) | 40 | 40 | 40 |
| | Substrate temperature (° C.) | 80 | 80 | 80 |
| Annealing | Annealing temperature (° C.) | 300 | 300 | 300 |
| | Annealing time (min) | 60 | 60 | 60 |
| | Atmosphere | Air | Air | Air |
| Hall measurement | Carrier concentration (cm$^{-3}$) | 4.83E+17 | 6.34E+17 | 4.72E+17 |
| TFT | Channel width/channel length (μm) | 20/5 | 20/5 | 20/5 |
| | Source/drain | Mo | Mo | Mo |
| | Source/drain patterning | Dry etching | Dry etching | Dry etching |
| | Protective film | SiOx/SiNx | SiOx/SiNx | SiOx/SiNx |
| | Mobility (cm$^2$/Vs) | 19.7 | 16.8 | 18.0 |
| | Threshold voltage (V) | 1.6 | 1.0 | 0.82 |
| | S value (V/dec) | 0.11 | 0.12 | 0.16 |

INDUSTRIAL APPLICABILITY

The thin film transistor obtained by using the sputtering target of the invention can be used for a display, in particular, for a large-area display.

Although only some exemplary embodiments and/or examples of the invention have been described in detail above, those skilled in the art will readily appreciate that many modifications are possible in the exemplary embodiments and/or examples without materially departing from the novel teachings and advantages of the invention. Accordingly, all such modifications are intended to be included within the scope of the invention.

The specification of the Japanese patent application to which the present application claims priority under the Paris Convention are incorporated herein by reference in their entirety.

The invention claimed is:

1. An oxide semiconductor thin film formed by a sputtering method with the use of a sputtering target comprising an oxide that comprises an indium (In) element, a tin (Sn) element, a zinc (Zn) element and an aluminum (Al) element wherein the atomic ratio of In, Sn, Zn and Al satisfies the following formulas (1) to (4):

$$0.50 \leq In/(In+Sn+Zn+Al) \leq 0.75 \quad (1)$$

$$0.01 \leq Sn/(In+Sn+Zn+Al) \leq 0.30 \quad (2)$$

$$0.10 \leq Zn/(In+Sn+Zn+Al) \leq 0.70 \quad (3)$$

$$0.01 \leq Al/(In+Sn+Zn+Al) \leq 0.40 \quad (4)$$

and wherein in the formulas, In, Sn, Zn and Al independently indicate an atomic ratio of each element in the sputtering target.

2. A method for producing an oxide semiconductor thin film, wherein the film is formed by a sputtering method with the use of sputtering target in an atmosphere of a mixed gas that comprises: one or more selected from water vapor, an oxygen gas and a nitrous oxide gas and further comprises a rare gas;

wherein the sputtering target comprises an oxide that comprises an indium (In) element, a tin (Sn) element, a zinc (Zn) element and an aluminum (Al) element wherein the atomic ratio of In, Sn, Zn and Al satisfies the following formulas (1) to (4):

$$0.50 \leq In/(In+Sn+Zn+Al) \leq 0.75 \quad (1)$$

$$0.01 \leq Sn/(In+Sn+Zn+Al) \leq 0.30 \quad (2)$$

$$0.10 \leq Zn/(In+Sn+Zn+Al) \leq 0.70 \quad (3)$$

$$0.01 \leq Al/(In+Sn+Zn+Al) \leq 0.40 \quad (4)$$

and wherein in the formulas, In, Sn, Zn and Al independently indicate an atomic ratio of each element in the sputtering target.

3. The method for producing an oxide semiconductor thin film according to claim 2, wherein the formation of the oxide semiconductor thin film is conducted in an atmosphere of a mixed gas that comprises a rare gas and at least water vapor.

4. The method for producing an oxide semiconductor thin film according to claim 3, wherein the ratio of the water vapor contained in the mixed gas is 0.1% to 25% in terms of a partial pressure ratio.

5. The method for producing the oxide semiconductor thin film according to claim 2 comprising:

transporting substrates in sequence to positions opposing to 3 or more of the sputtering targets of claim 2 arranged in parallel with a prescribed interval in a vacuum chamber;

applying a negative potential and a positive potential alternately from an AC power source to each of the targets; and causing plasma to be generated on the target by applying at least one output from the AC power source while switching the target to which a potential is applied among two or more of the sputtering targets that are divergently connected to this AC power source, thereby forming a film on a substrate surface.

6. The method for producing an oxide semiconductor thin film according to claim 5, wherein the AC power density of the AC power source is 3 W/cm$^2$ or more and 20 W/cm$^2$ or less.

7. The method for producing an oxide semiconductor thin film according to claim 5, wherein the frequency of the AC power source is 10 kHz to 1 MHz.

8. A thin film transistor comprising, as a channel layer, the oxide semiconductor thin film formed by the method for producing an oxide semiconductor thin film according to claim 2.

9. The thin film transistor according to claim 8 that has a field effect mobility of 10 cm$^2$/Vs or more.

* * * * *